(12) United States Patent
Park et al.

(10) Patent No.: US 11,928,285 B2
(45) Date of Patent: Mar. 12, 2024

(54) TRANSPARENT DISPLAY DEVICE WITH TOUCH SENSOR

(71) Applicant: LG Display Co., Ltd., Seoul (KR)

(72) Inventors: JaeHee Park, Paju-si (KR); MiReum Lee, Paju-si (KR); Kihyung Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/977,888

(22) Filed: Oct. 31, 2022

(65) Prior Publication Data
US 2023/0195257 A1    Jun. 22, 2023

(30) Foreign Application Priority Data

Dec. 16, 2021 (KR) .................. 10-2021-0180782

(51) Int. Cl.
*G06F 3/041* (2006.01)
*G06F 3/044* (2006.01)
*H10K 59/40* (2023.01)

(52) U.S. Cl.
CPC .......... *G06F 3/0418* (2013.01); *G06F 3/0412* (2013.01); *G06F 3/04164* (2019.05); *G06F 3/0446* (2019.05); *H10K 59/40* (2023.02)

(58) Field of Classification Search
CPC .. G06F 3/0418; G06F 3/0446; G06F 3/04164; G06F 3/0412; H10K 59/40
See application file for complete search history.

(56) References Cited

U.S. PATENT DOCUMENTS

| | | | |
|---|---|---|---|
| 2018/0166518 A1* | 6/2018 | Kim | H10K 59/124 |
| 2021/0151709 A1* | 5/2021 | Yoneda | H10K 50/166 |

* cited by examiner

*Primary Examiner* — Lisa S Landis
(74) *Attorney, Agent, or Firm* — Seed IP Law Group LLP

(57) ABSTRACT

A transparent display device with a touch sensor is provided, which may reduce loss of light transmittance due to a touch sensor and a touch line, and may detect a line area, in which a defective touch sensor is included. The device includes a substrate provided with a plurality of transmissive areas and a non-transmissive area disposed between the transmissive areas adjacent to each other. The device includes a touch line extended from the non-transmissive area and connected to a touch sensor electrode, and a common power line connected to a cathode electrode to supply a cathode power source. The non-transmissive area includes a cathode power area to which the cathode power source is applied through the common power line, the cathode power area includes a first cathode power area and a second cathode power area. The second cathode power area may have resistance higher than that of the first cathode power area.

16 Claims, 18 Drawing Sheets

TRANSPARENT DISPLAY DEVICE WITH TOUCH SENSOR

BACKGROUND

Technical Field

The present disclosure relates to a transparent display device with a touch sensor.

Description of the Related Art

Recently, studies for a transparent display device in which a user may view objects or images positioned at an opposite side through the display device are actively ongoing. The transparent display device includes a display area on which an image is displayed, wherein the display area may include a transmissive area capable of transmitting external light and a non-transmissive area, and may have high light transmittance through the transmissive area.

A transparent display device may be provided with a plurality of touch sensors and a plurality of touch lines to implement a touch function.

BRIEF SUMMARY

The transparent display device, however, may have problems in that it is not easy to form the plurality of touch sensors and the plurality of touch lines or a process is complicated and light transmittance may be reduced due to the plurality of touch sensors and the plurality of touch lines. One or more embodiments of the present disclosure address the various technical problems in the related art and the problems identified above.

One or more embodiments of the present disclosure provide a transparent display device that may reduce or minimize loss of light transmittance due to a touch sensor and a touch line.

One or more embodiments of the present disclosure provide a transparent display device that may detect a defective touch sensor of a plurality of touch sensors provided in a block.

In addition to the technical benefits of the present disclosure as mentioned above, additional benefits and features of the present disclosure will be clearly understood by those skilled in the art from the following description of the present disclosure.

In accordance with an aspect of the present disclosure, the above and other objects can be accomplished by the provision of a transparent display device with a touch sensor, comprising a substrate provided with a plurality of transmissive areas and a non-transmissive area disposed between the transmissive areas adjacent to each other, a plurality of touch sensors respectively provided in the plurality of transmissive areas over the substrate, including a touch sensor electrode, a plurality of pixels disposed in the non-transmissive area over the substrate, including an anode electrode, a light emitting layer and a cathode electrode, a touch line extended in the non-transmissive area in a first direction and connected to the touch sensor electrode, and a common power line connected to the cathode electrode to supply a cathode power source. The non-transmissive area includes a cathode power area to which the cathode power source is applied through the common power line, the cathode power area includes a first cathode power area disposed between the touch sensors adjacent to each other in a second direction and a second cathode power area disposed between the touch sensors adjacent to each other in the first direction. The second cathode power area may have resistance higher than that of the first cathode power area.

BRIEF DESCRIPTION OF THE SEVERAL VIEWS OF THE DRAWINGS

The above and other features and other advantages of the present disclosure will be more clearly understood from the following detailed description taken in conjunction with the accompanying drawings, in which.

DETAILED DESCRIPTION

Figure 1:
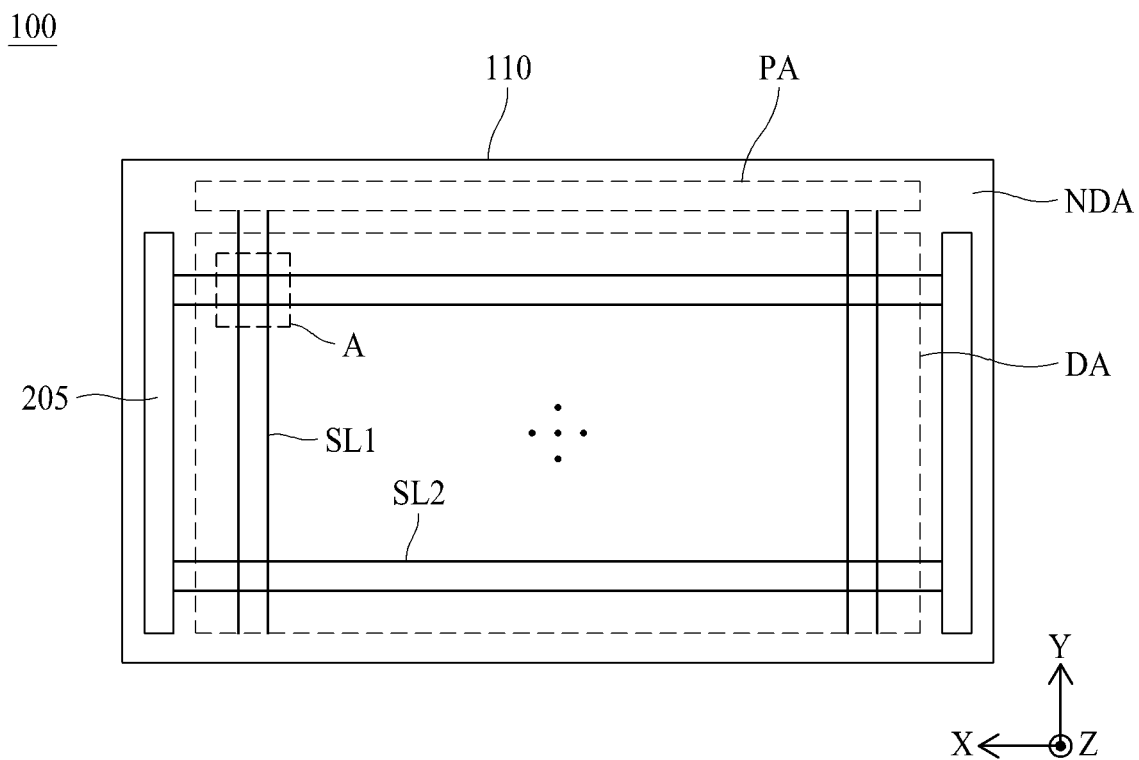
FIG. 1 is a schematic plan view illustrating a transparent display panel.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a dimension (e.g., length, width, height, thickness, radius, diameter, area, etc.), a ratio, an angle, and a number of elements disclosed in the drawings for describing embodiments of the present disclosure are merely an example, and thus, the present disclosure is not limited to the illustrated details.

A dimension including size and a thickness of each component illustrated in the drawing are illustrated for convenience of description, and the present disclosure is not limited to the size and the thickness of the component illustrated, but it is to be noted that the relative dimensions including the relative size, location and thickness of the components illustrated in various drawings submitted herewith are part of the present disclosure.

Like reference numerals refer to like elements throughout the specification. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~,' one or more portions may be arranged between two other portions unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

FIG. 1 is a schematic plan view illustrating a transparent display panel.

Hereinafter, X axis indicates a line parallel with a scan line, Y axis indicates a line parallel with a data line, and Z axis indicates a height direction of a transparent display device 100.

Although a description has been described based on that the transparent display device 100 according to one embodiment of the present disclosure is embodied as an organic light emitting display device, the transparent display device 100 may be embodied as a liquid crystal display device, a plasma display panel (PDP), a Quantum dot Light Emitting Display (QLED) or an Electrophoresis display device.

Referring to FIG. 1, a transparent display device according to one embodiment of the present disclosure includes a transparent display panel 110. The transparent display panel 110 may include a display area DA provided with pixels to display an image, and a non-display area NDA for not displaying an image.

The display area DA may be provided with a first signal lines SL1, a second signal lines SL2 and the pixels. The non-display area NDA may be provided with a pad area PA in which pads are disposed, and at least one scan driver 205.

The first signal lines SL1 may be extended in a first direction (e.g., Y-axis direction). The first signal lines SL1 may cross the second signal lines SL2 in the display area DA. The second signal lines SL2 may be extended in the display area DA in a second direction (e.g., X-axis direction). The pixel may be provided in an area where the first signal line SL1 and the second signal line SL2 cross each other, and emits predetermined light to display an image.

The scan driver 205 are connected to the scan lines and supplies scan signals to the scan lines. The scan driver 205 may be disposed in the non-display area NDA on one side or both sides of the display area DA of the transparent display panel 110 by a gate driver in panel (GIP) method or a tape automated bonding (TAB) method.

The transparent display panel 110 may further include a touch line and a touch sensor in addition to the first signal line SL1, the second signal line SL2 and the pixel in order to implement a touch function. A detailed description of the touch line and the touch sensor will be described later with reference to FIGS. 2 to 16.

Figure 2:
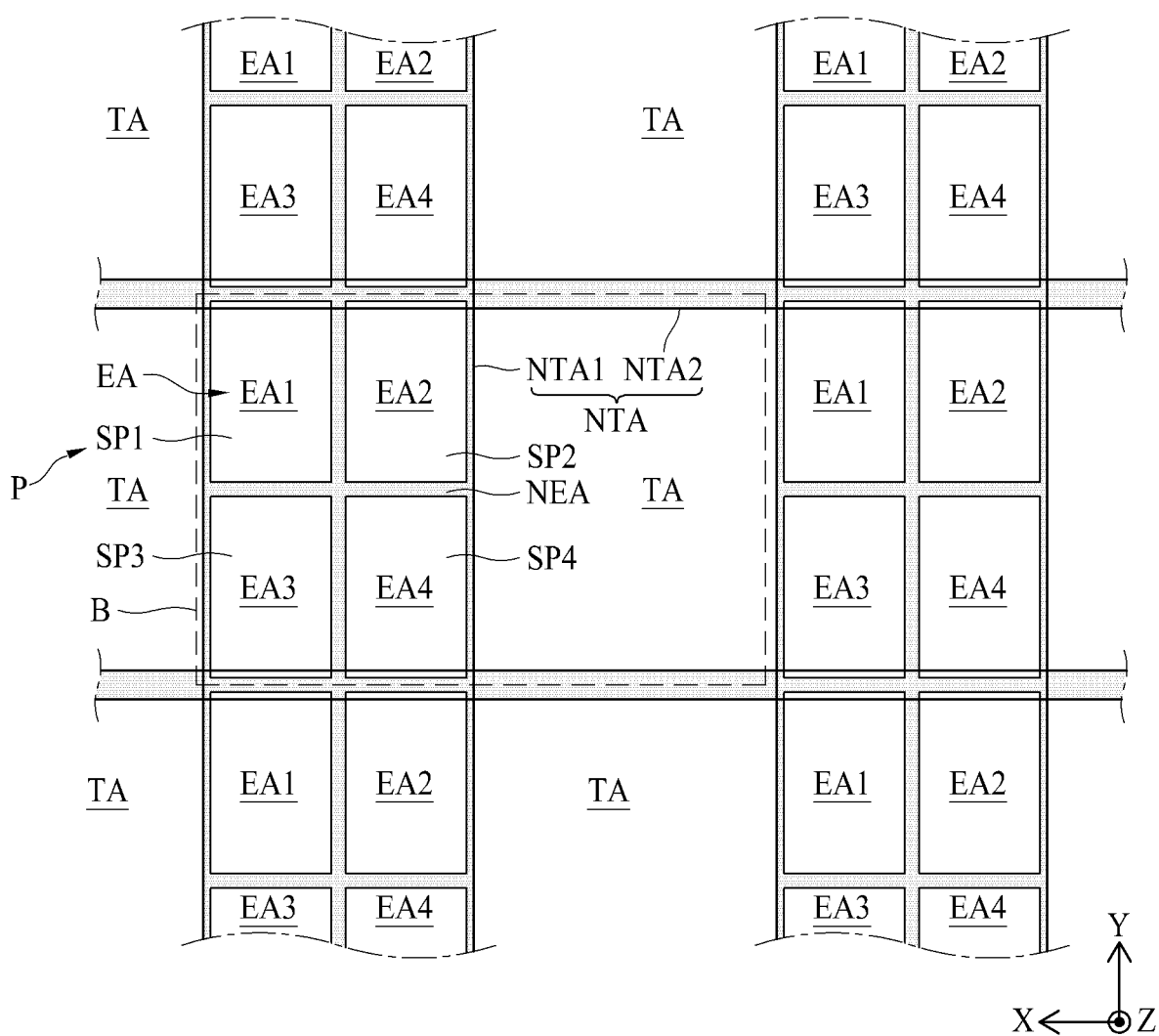
FIG. 2 is a schematic view illustrating an example of a pixel provided in an area A of FIG. 1.
Figure 3:
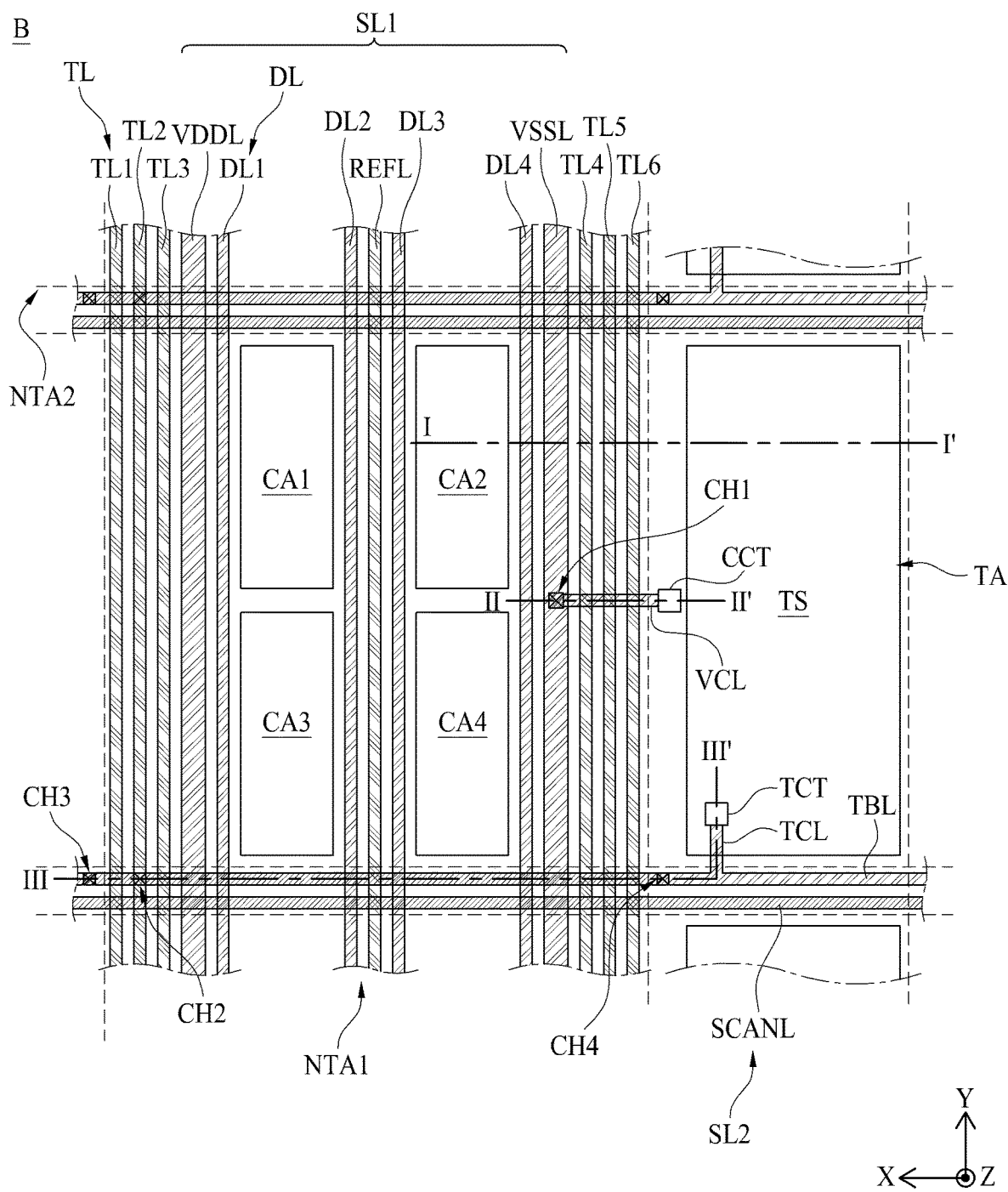
FIG. 3 is a view illustrating an example of signal lines, touch lines and a touch sensor, which are provided in an area B of FIG. 2.

FIG. 2 is a schematic view illustrating an example of a pixel provided in an area A of FIG. 1, and FIG. 3 is a view illustrating an example of signal lines, touch lines and a touch sensor, which are provided in an area B of FIG. 2.

The display area DA, as shown in FIG. 2, includes a transmissive area TA and a non-transmissive area NTA. The transmissive area TA is an area through which most of externally incident light passes, and the non-transmissive area NTA is an area through which most of externally incident light fails to transmit. For example, the transmissive area TA may be an area where light transmittance is greater than $\alpha$ %, for example, about 90%, and the non-transmissive area NTA may be an area where light transmittance is smaller than (3%, for example, about 50%. At this time, a is greater than $\beta$. A user may view an object or background arranged over a rear surface of the transparent display panel 110 due to the transmissive area TA.

The non-transmissive area NTA may include a first non-transmissive area NTA1, a second non-transmissive area NTA2 and a plurality of pixels P. Pixels P may be provided to at least partially overlap at least one of the first signal line SL1 and the second signal line SL2, thereby emitting predetermined light to display an image. A light emission area EA may correspond to an area, from which light is emitted, in the pixel P.

Each of the pixels P, as shown in FIG. 2, may include at least one of a first subpixel SP1, a second subpixel SP2, a third subpixel SP3 and a fourth subpixel SP4. The first subpixel SP1 may include a first light emission area EA1 emitting light of a first color. The second subpixel SP2 may include a second light emission area EA2 emitting light of a second color. The third subpixel SP3 may include a third light emission area EA3 emitting light of a third color. The fourth subpixel SP4 may include a fourth light emission area EA4 emitting light of a fourth color.

The first to fourth light emission area EA1, EA2, EA3 and EA4 may emit light of different colors. For example, the first light emission area EA1 may emit light of a green color. The second light emission area EA2 may emit light of a red color. The third light emission area EA3 may emit light of a blue color. The fourth light emission area EA4 may emit light of a white color. However, the light emission areas are not limited to this example. Each of the pixels P may further include a subpixel emitting light of a color other than red, green, blue and white. Also, the arrangement order of the subpixels SP1, SP2, SP3 and SP4 may be changed in various ways.

The first non-transmissive area NTA1 may be extended in a first direction (Y-axis direction) in a display area DA, and may be disposed to at least partially overlap light emission areas EA1, EA2, EA3 and EA4. A plurality of first non-transmissive areas NTA1 may be provided in the transparent display panel 110, and a transmissive area TA may be provided between two adjacent first non-transmissive areas NTA1. In the first non-transmissive area NTA1, first signals lines extended in the first direction (Y-axis direction) and touch lines TL extended in the first direction (Y-axis direction) may be disposed to be spaced apart from each other.

For example, the first signal lines SL1 may include at least one of a pixel power line VDDL, a common power line VSSL, a reference line REFL or data lines DL1, DL2, DL3 and DL4.

The pixel power line VDDL may supply a first power source to a driving transistor DTR of each of subpixels SP1, SP2, SP3 and SP4 provided in the display area DA.

The common power line VSSL may supply a second power source to a cathode electrode of the subpixels SP1, SP2, SP3 and SP4 provided in the display area DA. At this time, the second power source may be a common power source commonly supplied to the subpixels SP1, SP2, SP3 and SP4.

The common power line VSSL may supply the second power source to the cathode electrode through a cathode contact electrode CCT provided between the transmissive area TA and the common power line VSSL. A power connection line VCL may be disposed between the common power line VSSL and the cathode contact electrode CCT. One end of the power connection line VCL may be connected to the common power line VS SL through a first contact hole CH1 and the other end thereof may be connected to the cathode contact electrode CCT. The cathode electrode may be connected to the cathode contact electrode CCT. As a result, the cathode electrode may be electrically connected to the common power line VSSL through the power connection line VCL and the cathode contact electrode CCT.

The reference line REFL may supply an initialization voltage (or reference voltage) to the driving transistor DTR of each of the subpixels SP1, SP2, SP3 and SP4 provided in the display area DA.

The reference line REFL may be disposed between the plurality of data lines DL1, DL2, DL3 and DL4. For example, the reference line REFL may be disposed at the center of the plurality of data lines DL1, DL2, DL3 and DL4, that is, between the second data line DL2 and the third data line DL3.

The reference line REFL may be diverged and connected to the plurality of subpixels SP1, SP2, SP3 and SP4. In detail, the reference line REFL may be connected to circuit elements of the plurality of subpixels SP1, SP2, SP3 and SP4 to supply an initialization voltage (or reference voltage) to each of the subpixels SP1, SP2, SP3 and SP4.

When the reference line REFL is disposed to be close to the edge of the first non-transmissive area NTA1, a deviation between connection lengths from a diverged point to a circuit element of a plurality of subpixels SP1, SP2, SP3 and SP4 is increased. In a transparent display panel 110 according to one embodiment of the present disclosure, the reference line REFL is disposed in a middle area of the first non-transmissive area NTA1, whereby the deviation between the connection lengths to the circuit element of each of the plurality of subpixels SP1, SP2, SP3 and SP4 may be reduced or minimized. Therefore, the reference line REFL may uniformly supply signals to the circuit elements of the plurality of subpixels SP1, SP2, SP3 and SP4.

Each of the data lines DL1, DL2, DL3 and DL4 may supply a data voltage to the subpixels SP1, SP2, SP3 and SP4. For example, the first data line DL1 may supply a first data voltage to a first driving transistor of the first subpixel SP1, the second data line DL2 may supply a second data voltage to a second driving transistor of the second subpixel SP2, the third data line DL3 may supply a third data voltage to a third driving transistor of the third subpixel SP3 and the fourth data line DL4 may supply a fourth data voltage to a fourth driving transistor of the fourth subpixel SP4.

In the transparent display panel 110 according to one embodiment of the present disclosure, the touch line TL may be further disposed in the first non-transmissive area NTA1. At least two touch lines TL may be provided in the first non-transmissive area NTA1. When the plurality of touch lines TL are disposed in the transmissive area TA of the transparent display panel 110, light transmittance may be deteriorated due to the plurality of touch lines TL.

Also, a slit, specifically an elongated linear or rectangular shape, may be provided between the plurality of touch lines TL. When external light passes through the slit, a diffraction phenomenon may occur. According to the diffraction phenomenon, light corresponding to plane waves may be changed to spherical waves as the light passes through the slit, and an interference phenomenon may occur in the spherical waves. Therefore, constructive interference and destructive interference occur in the spherical waves, whereby the external light that has passed through the slit may have irregular light intensity. As a result, in the transparent display panel 110, definition of an object or image positioned at an opposite side may be reduced. For this reason, in one embodiment, the plurality of touch lines TL are preferably disposed in the first non-transmissive area NTA1 rather than the transmissive area TA.

A plurality of touch lines TL may be disposed between first signal lines SL1 in the first non-transmissive area NTA1 and a transmissive area TA as shown in FIG. 3. For example, six touch lines TL1, TL2, TL3, TL4, TL5 and TL6 may be disposed in one first non-transmissive area NTA1. Three TL1, TL2 and TL3 of the six touch lines TL1, TL2, TL3, TL4, TL5 and TL6 may be disposed between a pixel power line VDDL and the transmissive area TA, and the other three touch lines TL4, TL5 and TL6 may be disposed between a common power line VSSL and the transmissive area TA, but are not limited to this arrangement. In one embodiment, it is beneficial to have the plurality of touch lines TL so as not to overlap circuit areas CA1, CA2, CA3 and CA4 in which circuit elements are disposed, and various modifications may be made in the arrangement order of the plurality of touch lines TL with the first signal lines SL1.

The transparent display panel 110 according to one embodiment of the present disclosure includes a pixel P between adjacent transmissive areas TA, and the pixel P may include light emission areas EA1, EA2, EA3 and EA4 in which a light emitting element is disposed to emit light. Since a size of the non-transmissive area NTA is small in the transparent display panel 110, the circuit element may be disposed to at least partially overlap the light emission areas EA1, EA2, EA3 and EA4. That is, the light emission areas EA1, EA2, EA3 and EA4 may include circuit areas CA1, CA2, CA3 and CA4 in which the circuit elements are disposed.

For example, the circuit areas may include a first circuit area CA1 in which a circuit element connected to the first subpixel SP1 is disposed, a second circuit area CA2 in which a circuit element connected to the second subpixel SP2 is disposed, a third circuit area CA3 in which a circuit element connected to the third subpixel SP3 is disposed, and a fourth circuit area CA4 in which a circuit element connected to the fourth subpixel SP4 is disposed.

In a transparent display panel 110 according to one embodiment of the present disclosure, a plurality of touch lines TL do not overlap circuit areas CA1, CA2, CA3 and CA4, so that parasitic capacitance of the touch lines TL due to a circuit element may be reduced or minimized.

Furthermore, the transparent display panel 110 according to one embodiment of the present disclosure may reduce a horizontal distance difference between the touch lines TL. Since at least two transistors and capacitors are disposed in the circuit areas CA1, CA2, CA3 and CA4, it is difficult to form the touch lines TL in a straight line in the circuit areas CA1, CA2, CA3 and CA4, so that the touch lines TL may have difficulty in having a certain horizontal distance. Therefore, the horizontal distance difference between the touch lines TL is increased, whereby uniformity in parasitic capacitance may be significantly lowered.

In the transparent display panel 110 according to one embodiment of the present disclosure, the touch lines TL are disposed so as not to overlap the circuit areas CA1, CA2, CA3 and CA4, whereby influence due to the circuit element may be reduced, and at the same time the horizontal distance difference between the touch lines TL may be reduced to improve uniformity of parasitic capacitance.

The second non-transmissive area NTA2 may be extended in the display area DA in a second direction (X-axis direction), and may be disposed to at least partially overlap the light emission areas EA1, EA2, EA3 and EA4. A plurality of second non-transmissive areas NTA2 may be provided in the transparent display panel 110, and the transmissive area TA may be provided between two adjacent second non-transmissive areas NTA2. The second signal line SL2 and a touch bridge line TBL may be disposed to be spaced apart from each other in the second non-transmissive area NTA2.

A second signal line SL2 may be extended in a second direction (X-axis direction), and may include, for example, a scan line SCANL. The scan line SCANL may supply a scan signal to the subpixels SP1, SP2, SP3 and SP4 of the pixel P.

A touch bridge line TBL may connect any one of the plurality of touch lines TL with a touch sensor TS. The touch bridge line TBL may be connected to any one of the plurality of touch lines TL through a second contact hole CH2. Also, the touch bridge line TBL may be connected to at least two touch sensors TS arranged in a second direction (X-axis direction) while being extended in the second direction (X-axis direction).

In the transparent display panel 110 according to one embodiment of the present disclosure, the plurality of touch lines TL may be disposed in a first non-transmissive area NTA1 not a second non-transmissive area NTA2, so that light transmittance may be prevented from being deteriorated due to the plurality of touch lines TL. The second non-transmissive area NTA2 extended in the second direction (X-axis direction) crosses between adjacent transmissive areas TA as shown in FIG. 3. When a width of the second non-transmissive area NTA2 crossing the transmissive areas TA is increased, a size of the transmissive area TA is necessarily reduced.

When the plurality of touch lines TL are disposed in the second non-transmissive area NTA2, the width of the second non-transmissive area NTA2 is increased to dispose a large number of lines, and the size of the transmissive area TA is reduced. That is, a problem may occur in that light transmittance of the transparent display panel 110 is reduced due to the plurality of touch lines TL.

In the transparent display panel 110 according to one embodiment of the present disclosure, the plurality of touch lines TL may be disposed in the first non-transmissive area NTA1, and only one touch bridge line TBL for connecting the plurality of touch sensors TS may be provided in the second non-transmissive area NTA2. Therefore, the transparent display panel 110 according to one embodiment of the present disclosure may reduce or minimize the size decrease of the transmissive area TA or decrease in light transmittance due to the plurality of touch lines TL and the touch bridge line TBL.

The touch sensor TS may be provided in the transmissive area TA. The touch sensor TS may be disposed in each of the plurality of transmissive areas TA, and may be changed in capacitance during user contact. A touch driver (not shown) may be connected to the plurality of touch sensors TS through the plurality of touch lines TL to detect a change in capacitance of the plurality of touch sensors TS.

Hereinafter, a connection relation among a plurality of touch sensors TS, a plurality of touch lines TL and a plurality of touch bridge lines TBL will be described in more detail with reference to FIGS. 4 and 5.

Figure 4:
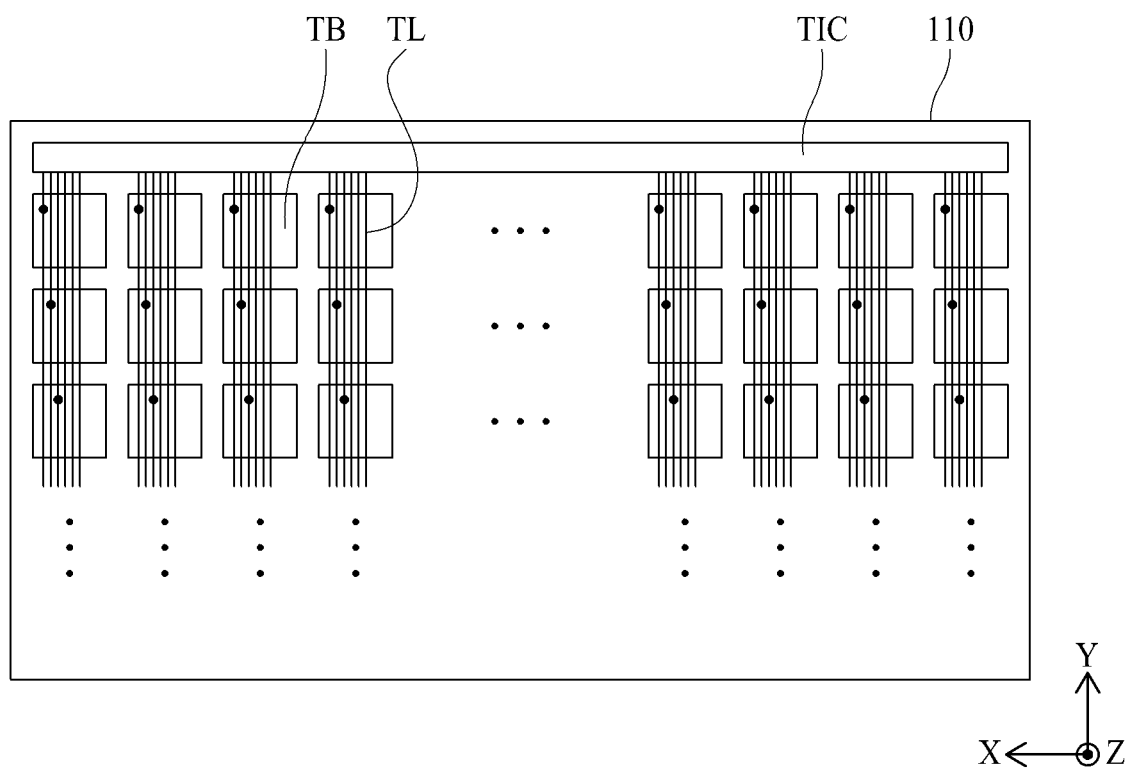
FIG. 4 is a view illustrating a connection relation between a plurality of touch blocks and a plurality of touch lines.
Figure 5:
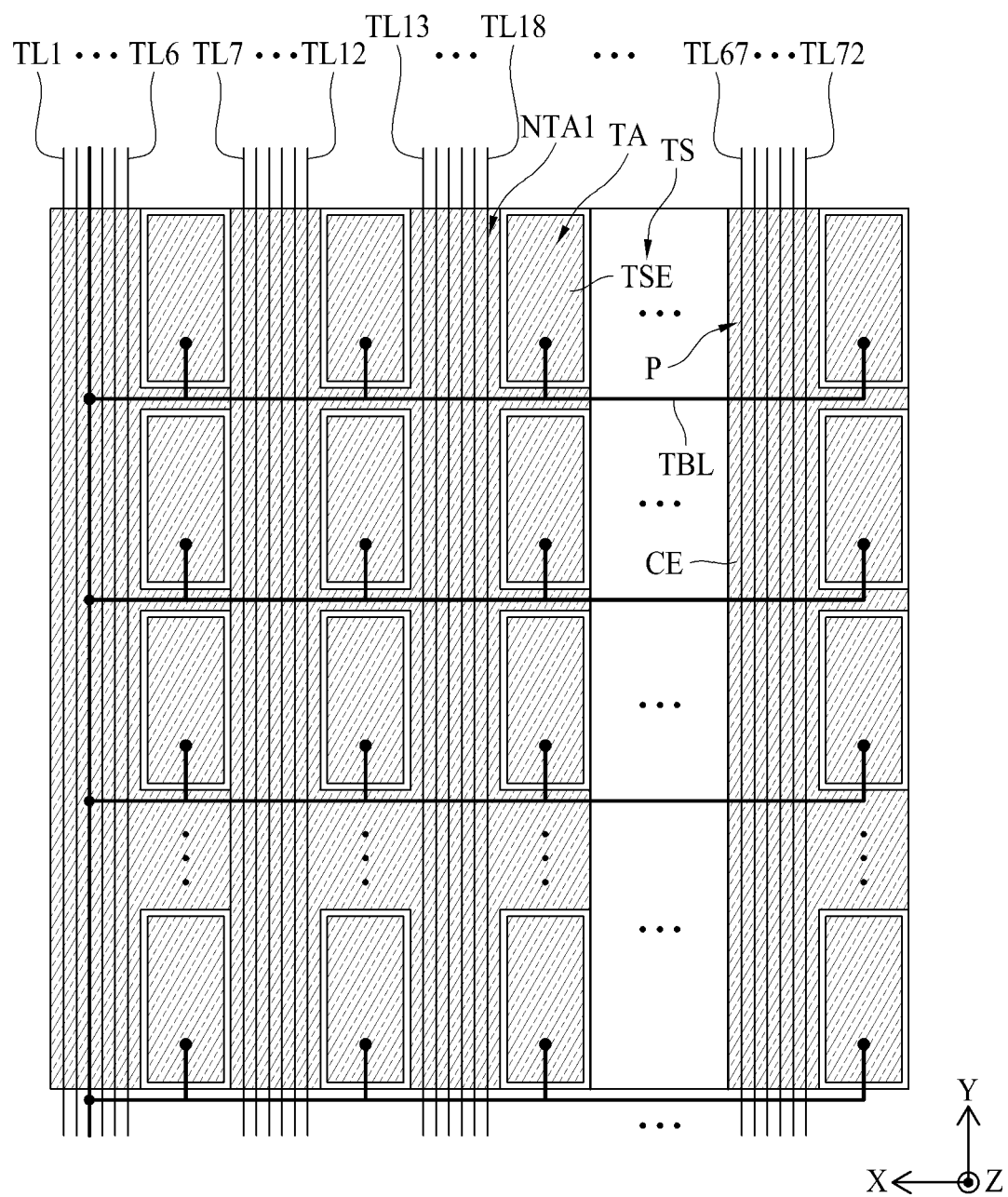
FIG. 5 is a view illustrating a connection relation between a plurality of touch lines and a plurality of touch sensors in one touch block.

FIG. 4 is a view illustrating a connection relation between a plurality of touch blocks and a plurality of touch lines, and FIG. 5 is a view illustrating a connection relation between a plurality of touch lines and a plurality of touch sensors in one touch block.

Referring to FIGS. 4 to 5, the transparent display panel 110 according to one embodiment of the present disclosure may include a plurality of touch blocks TB. Each of the plurality of touch blocks TB may include a plurality of pixels P and a plurality of transmissive areas TA disposed to correspond to the plurality of pixels P one-to-one as a basic unit for determining a user touch position. For example, each of the plurality of touch blocks TB may include 12×15 pixels P and 12×15 touch sensors TS. In this case, when image resolution is 1920×1080, touch resolution may be 160×72.

At this time, the touch sensor TS may include a touch sensor electrode TSE. The touch sensor electrode TSE may include the same material in the same layer as the cathode electrode CE of the pixel P. In this case, the touch sensor electrode TSE and the cathode electrode CE may be disposed to be spaced apart from each other.

In the transparent display panel 110 according to one embodiment of the present disclosure, as each of the plurality of touch lines TL is connected to one of the plurality of touch blocks TB, a change in capacitance of the touch sensors TS provided in the connected touch block TB may be sensed. That is, the plurality of touch lines TL provided in the transparent display panel 110 may correspond to the plurality of touch blocks TB one-to-one. Therefore, the number of touch lines TL may be the same as the number of touch blocks TB in the transparent display panel 110. For example, when the number of touch blocks TB is 160×72, the touch line TL may also be 160×72, and may be connected to the touch driver TIC.

As described above, in order to form the touch lines TL as much as the number of touch blocks TB, at least two touch lines TL should be provided in one first non-transmissive area NTA1. For example, when image resolution is 1920×1080 and touch resolution is 160×72, six touch lines TL1, TL2, TL3, TL4, TL5 and TL6 may be provided in one first non-transmissive area NTA1, as shown in FIG. 3, in order to form 160×72 touch lines TL in the transparent display panel 110.

The plurality of touch sensors TS provided in one touch block TB may be connected to one of the plurality of touch lines TL provided in one touch block TB as shown in FIG. 5. For example, twelve first non-transmissive areas NTA1 may be provided in one touch block TB, and six touch lines TL1, TL2, TL3, TL4, TL5 and TL6 may be disposed in each of the twelve first non-transmissive areas NTA1. As a result, one touch block TB may be provided with 72 touch lines TL1, TL72. In this case, the plurality of touch sensors TS provided in one touch block TB may be connected to one specific touch line TL of the 72 touch lines TL1, TL72. At this time, the specific touch line TL may be connected to the plurality of touch sensors TS arranged in the second direction (X-axis direction) through the touch bridge lines TBL extended in the second direction (X-axis direction). As a result, the plurality of touch sensors TS provided in one touch block TB may be electrically connected through a specific touch line TL and the touch bridge lines TBL.

Each of the plurality of touch lines TL may correspond to touch blocks TB one-to-one. Therefore, the plurality of touch blocks TB are connected to different touch lines and thus may be electrically separated from each other. Each touch line TL may connect a plurality of touch sensors TS provided in a corresponding touch block TB to a touch driver TIC. In detail, each touch line TL may transmit the changed capacitance provided from the touch sensors TS provided in the touch block TB to the touch driver TIC. The touch driver TIC may sense the changed capacitance, and may determine a touch position of a user. Also, each touch line TL may provide the touch sensing voltage generated from the touch driver TIC to the touch sensors TS provided in the touch block TB.

Hereinafter, light emitting elements of a light emission area EA, the touch sensors TS of the transmissive area TA, and the connection relation between the touch sensors TS and the touch bridge line TBL will be described in more detail with reference to FIGS. 6 to 16.

Figure 6:
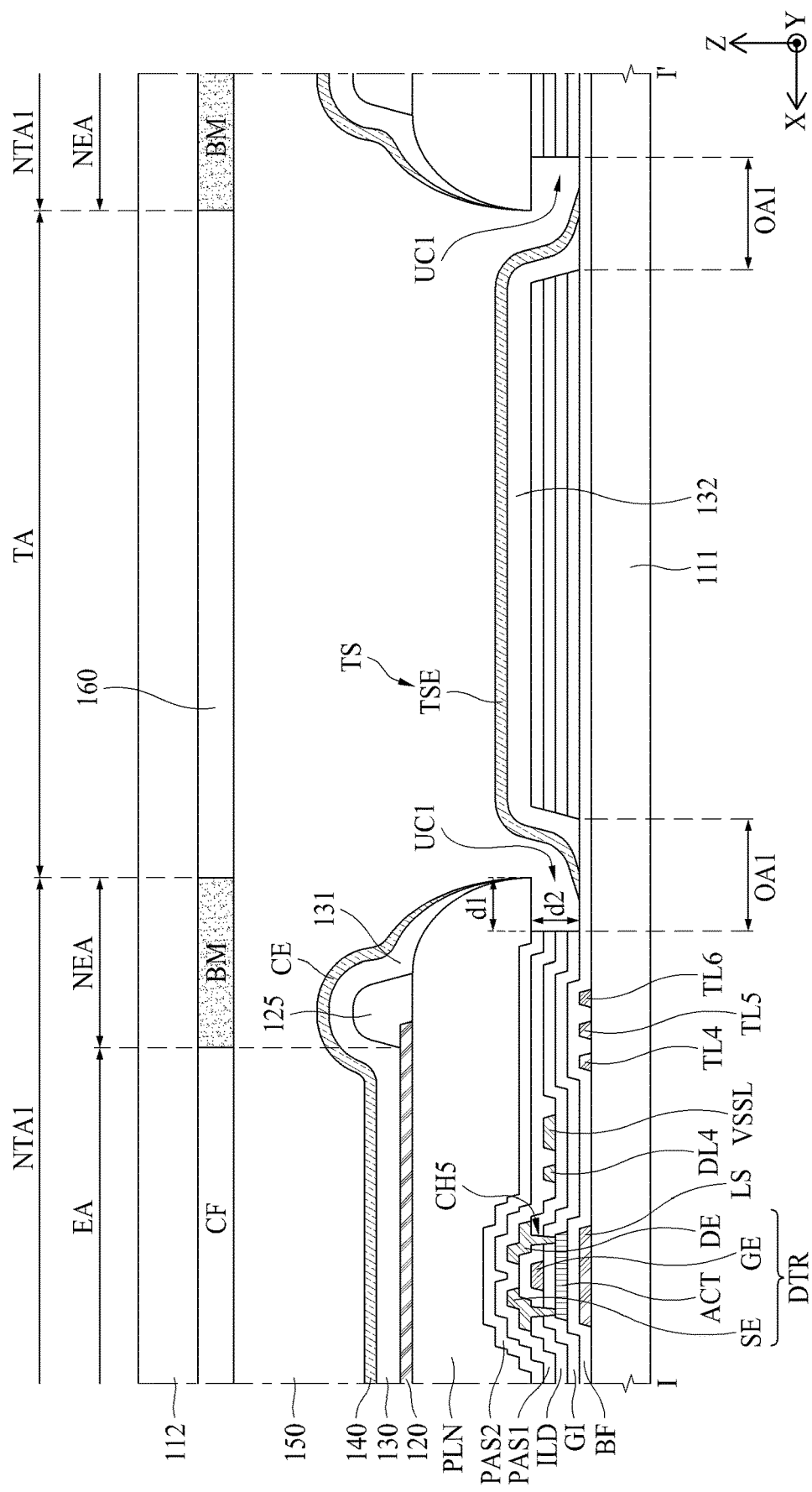
FIG. 6 is a cross-sectional view taken along line I-I' of FIG. 3.
Figure 7:
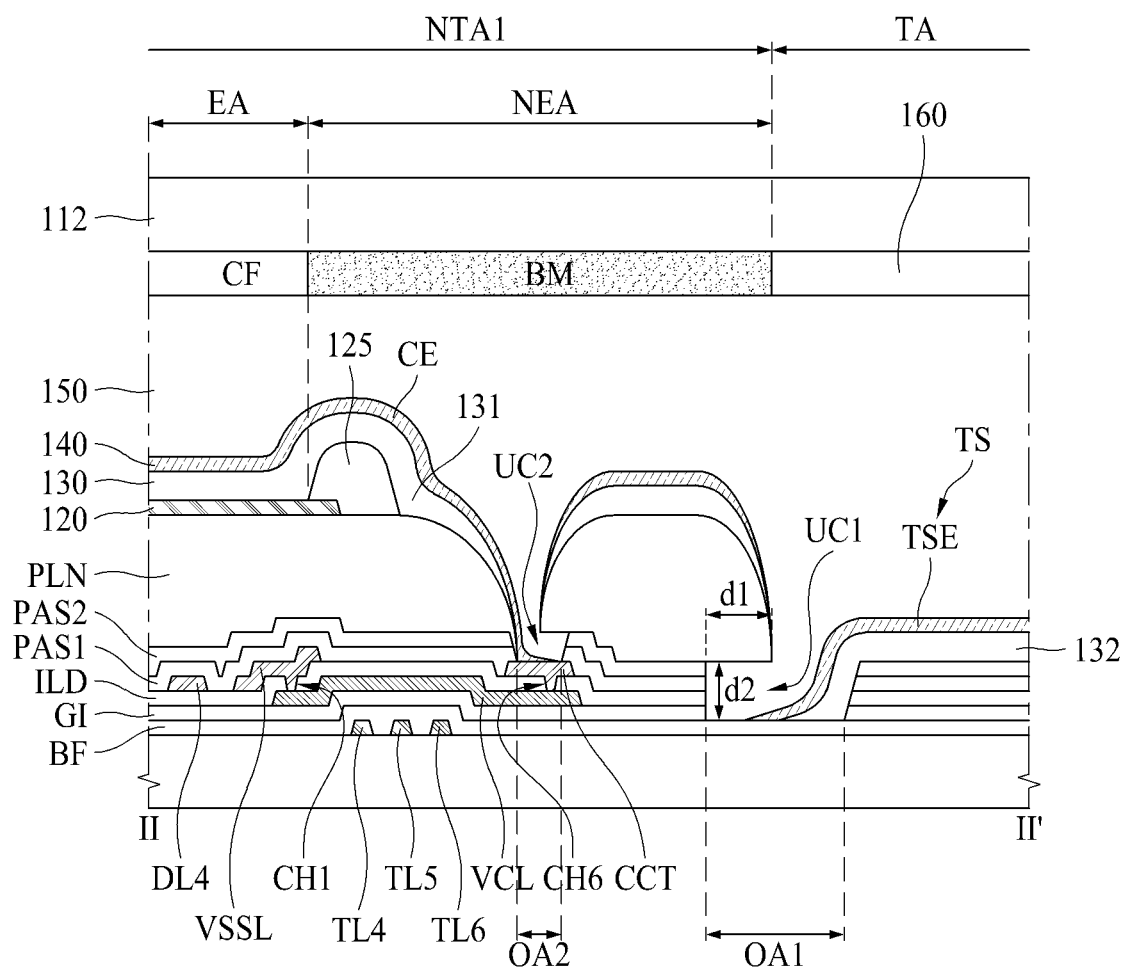
FIG. 7 is a cross-sectional view taken along line II-IF of FIG. 3.
Figure 8:
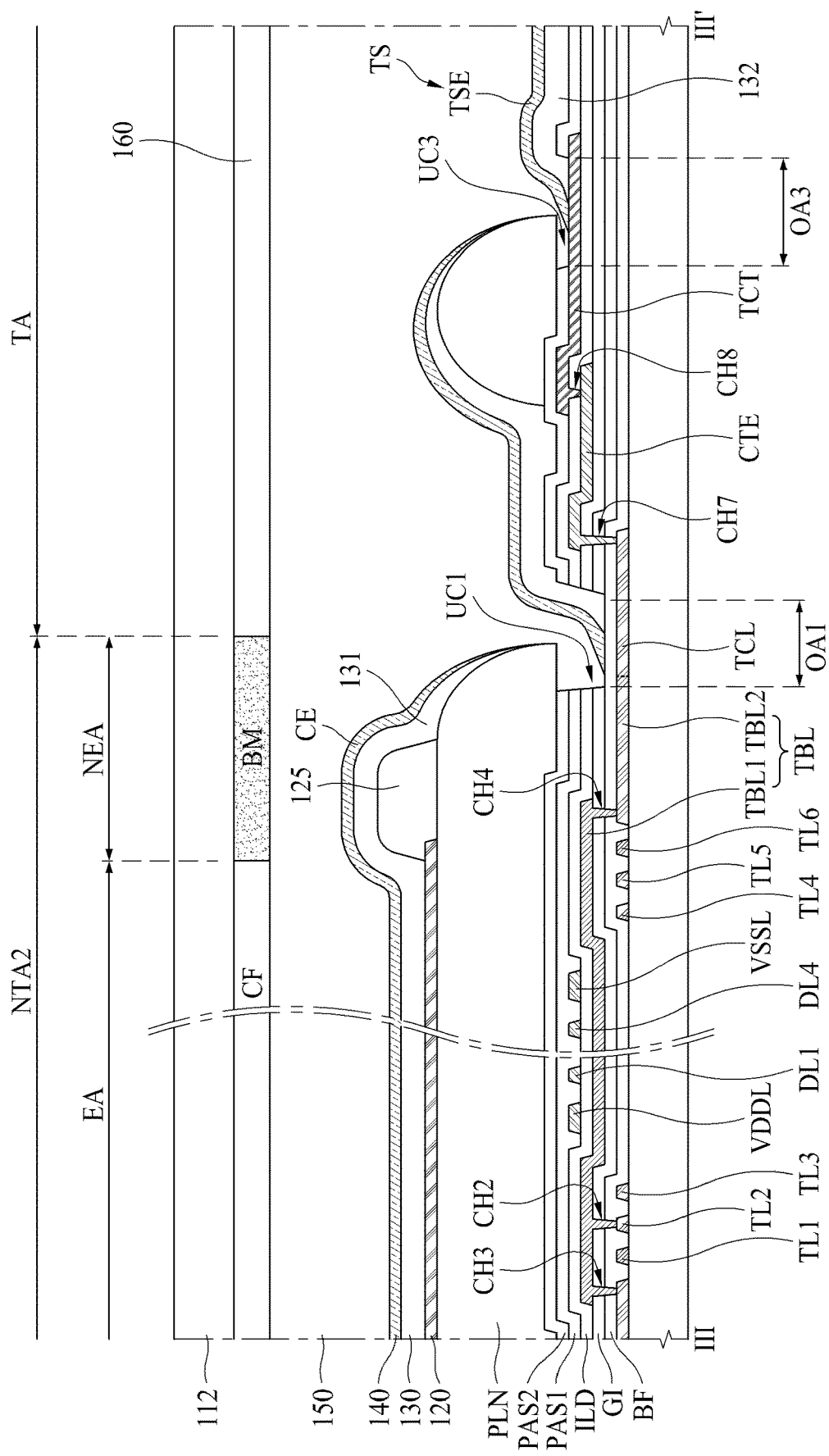
FIG. 8 is a cross-sectional view taken along line of FIG. 3.
Figure 9:
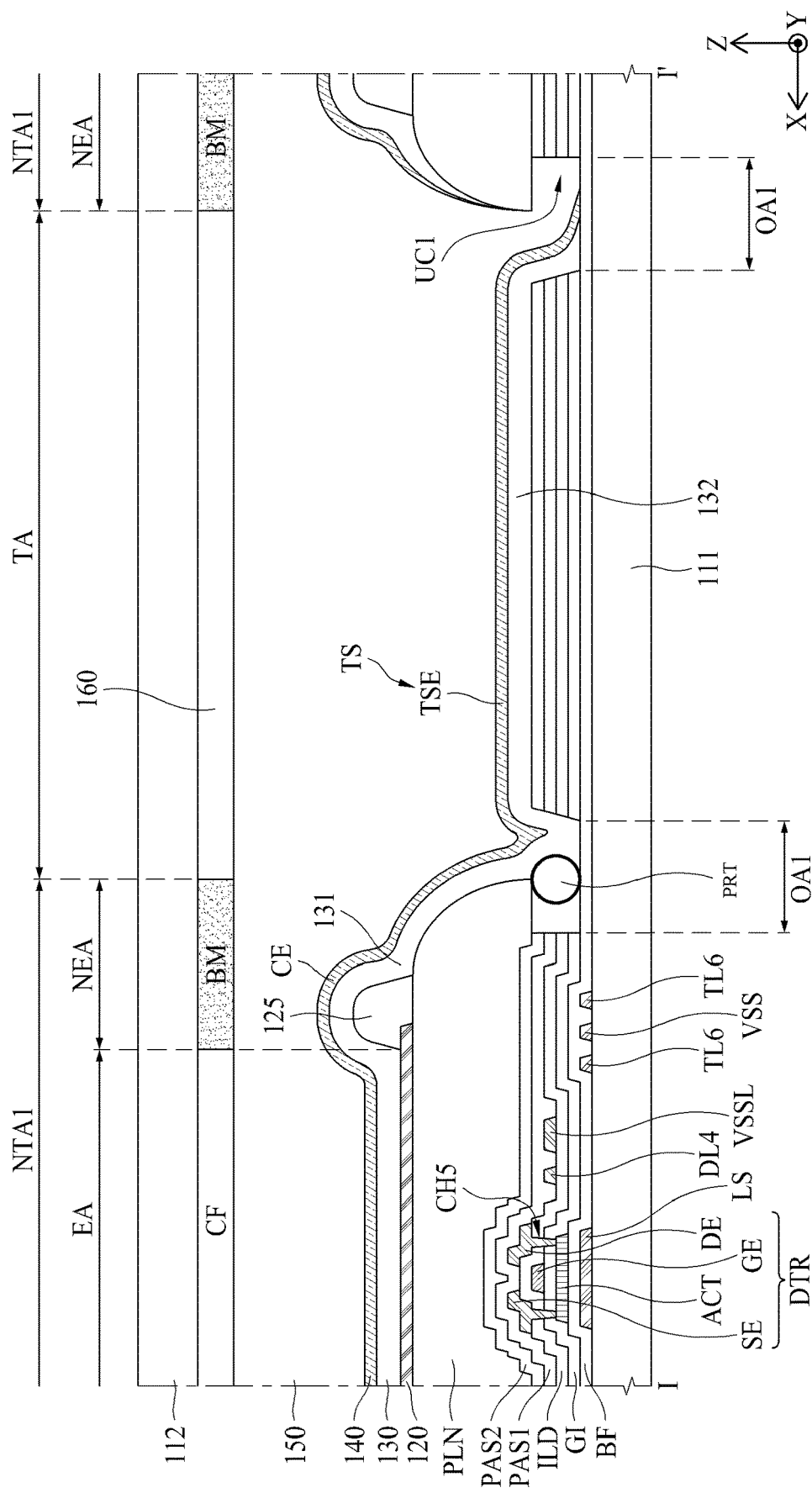
FIG. 9 is a view illustrating an example that a defective touch sensor occurs in a first undercut structure due to particles.

FIG. 6 is a cross-sectional view taken along line I-I' of FIG. 3, FIG. 7 is a cross-sectional view taken along line II-II' of FIG. 3, FIG. 8 is a cross-sectional view taken along line III-III' of FIG. 3, and FIG. 9 is a view illustrating an example that a defective touch sensor occurs in a first undercut structure due to particles.

Referring to FIGS. 3 and 6 to 9, a first substrate 111 of the transparent display panel 110 according to one embodiment of the present disclosure may include a plurality of transmissive areas TA, and a non-transmissive area NTA that includes a plurality of light emission areas EA disposed between the transmissive areas TA adjacent to each other. The non-transmissive area NTA may include a first non-transmissive area NTA1 extended in a first direction (Y-axis direction) and a second non-transmissive area NTA2 extended in a second direction (X-axis direction).

The first non-transmissive area NTA1 includes circuit areas CA1, CA2, CA3 and CA4 in which at least one transistor and a capacitor are disposed, and may be provided with a pixel power line VDDL, a common power line VSSL, a reference line REFL, data lines DL and touch lines TL, which are extended in the first direction (Y-axis direction) and disposed so as not to overlap the circuit areas CA1, CA2, CA3 and CA4. The second non-transmissive area NTA2 may include a scan line SCANL and a touch bridge line TBL, which are extended in the second direction (X-axis direction).

The at least one transistor may include a driving transistor DTR, switching transistors and a sensing transistor.

The switching transistor may be switched in accordance with a scan signal supplied to a scan line SCANL to charge a data voltage, which is supplied from the data line DL. The sensing transistor may serve to sense a threshold voltage deviation of the driving transistor DTR, which causes deterioration of image quality, in accordance with a sensing signal.

The driving transistor DTR is switched in accordance with the data voltage charged in the capacitor to generate a data current from a power source supplied from the pixel power line VDDL and supply the data current to a first electrode 120 of the subpixels SP1, SP2, SP3 and SP4. The driving transistor DTR may include an active layer ACT, a gate electrode GE, a source electrode SE, and a drain electrode DE.

As shown in FIG. 6, a light shielding layer LS may be provided over the first substrate 111. The light shielding layer LS may serve to shield external light incident on an active layer ACT in an area in which a driving transistor DTR is provided. The light shielding layer LS may include a single layer or multi-layer made of any one of molybdenum (Mo), aluminum (Al), chromium (Cr), gold (Au), titanium (Ti), nickel (Ni), neodymium (Nd) and copper (Cu), or their alloy.

The transparent display panel 110 according to one embodiment of the present disclosure may form at least a portion of the pixel power line VDDL, the common power line VSSL, the reference line REFL, the data lines DL and the touch lines TL in the same layer as the light shielding layer LS. For example, the reference line REFL and the touch lines TL may include the same material as that of the light shielding layer LS in the same layer as the light shielding layer LS, but are not limited thereto.

In the transparent display panel 110 according to one embodiment of the present disclosure, as shown in FIG. 8, a touch connection line TCL may include the same material as that of the light shielding layer LS in the same layer as the light shielding layer LS. One end of the touch connection line TCL may be connected to the touch bridge line TBL, and the other end thereof may be connected to a touch contact electrode TCT through a seventh contact hole CH7. At this time, since the touch connection line TCL is extended from the touch bridge line TBL disposed in the second non-transmissive area NTA2 to the touch contact electrode TCT disposed in the transmissive area TA, the touch connection line TCL crosses a first undercut structure UC1. The first undercut structure UC1 may be formed through a wet etching process. In the transparent display panel 110 according to one embodiment of the present disclosure, the touch connection line TCL may be formed in the same layer as the light shielding layer LS so that the touch connection line TCL may be prevented from being lost in the wet etching process for forming the first undercut structure UC1.

A buffer layer BF may be provided over the light shielding layer LS. The buffer layer BF is to protect the transistors DTR from water permeated through the first substrate 111 vulnerable to water permeation, and may include an inorganic layer, for example, a silicon oxide layer (SiOx), a silicon nitride layer (SiNx) or a multi-layer of the silicon oxide layer and the silicon nitride layer.

An active layer ACT of the driving transistor DTR may be provided over the buffer layer BF. The active layer ACT may include a silicon-based semiconductor material or an oxide-based semiconductor material.

A gate insulating layer GI may be provided over the active layer ACT of the driving transistor DTR. The gate insulating layer GI may be provided in the non-transmissive area NTA and the transmissive area TA. However, in order to form the first undercut structure UC1 in the transmissive area TA, the gate insulating layer GI may be provided with a first opening area OA1 that is formed to expose the buffer layer BF without being provided in at least a portion of the transmissive area TA. The gate insulating layer GI may include an inorganic layer, for example, a silicon oxide layer (SiOx), a silicon nitride layer (SiNx) or a multi-layer of the silicon oxide layer and the silicon nitride layer.

A gate electrode GE of the driving transistor DTR may be provided over the gate insulating layer GI. The gate electrode GE may include a single layer or multi-layer made of one of molybdenum (Mo), aluminum (Al), chromium (Cr), gold (Au), titanium (Ti), nickel (Ni), neodymium (Nd) and copper (Cu), or their alloy.

In the transparent display panel 110 according to one embodiment of the present disclosure, as shown in FIG. 7, a power connection line VCL may include the same material as that of the gate electrode GE. One end of the power connection line VCL may be connected to the common power line VSSL through a first contact hole CH1, and the other end thereof may be connected to a cathode contact electrode CCT through a sixth contact hole CH6.

Also, as shown in FIG. 8, in the transparent display panel 110 according to one embodiment of the present disclosure, a first touch bridge line TBL1 may include the same material as that of the gate electrode GE in the same layer as the gate electrode GE. In detail, the touch bridge line TBL may include a first touch bridge line TBL1 including the same material as that of the gate electrode GE in the same layer as the gate electrode GE and a second touch bridge line TBL2 including the same material as that of the light shielding layer LS in the same layer as the light shielding layer LS. The first touch bridge line TBL1 may be disposed in an area of the second non-transmissive area NTA2, which overlaps the first non-transmissive area NTA1, and thus may be connected to one of the plurality of touch lines TL through a second contact hole CH2. The second touch bridge line TBL2 may be disposed in an area of the second non-transmissive area NTA2, which does not overlap the first non-transmissive area NTA1, and thus may be connected to the first touch bridge line TBL1 through a fourth contact hole CH4.

The touch bridge line TBL is shown as including two layers in FIG. 8, but is not limited thereto. In another embodiment, the touch bridge line TBL may include only the first touch bridge line TBL1 including the same material as that of the gate electrode GE in the same layer as the gate electrode GE. The first touch bridge line TBL1 may be connected to one of the plurality of touch lines TL through the second contact hole CH2 in an area of the second non-transmissive area NTA2, which overlaps the first non-transmissive area NTA1. Also, the first touch bridge line TBL1 may be extended in the second direction (X-axis direction) to be connected to the touch connection line TCL through a contact hole.

An interlayer dielectric layer ILD may be provided over the gate electrode GE of the driving transistor DTR. The interlayer dielectric layer ILD may be provided in the non-transmissive area NTA and the transmissive area TA. However, the interlayer dielectric layer ILD may be provided with a first opening area OA1, which exposes the buffer layer BF without being provided in at least a portion of the transmissive area TA, to form a first undercut structure UC1 in the transmissive area TA. The interlayer dielectric layer ILD may include an inorganic layer, for example, a silicon oxide layer (SiOx), a silicon nitride layer (SiNx) or a multi-layer of the silicon oxide layer and the silicon nitride layer.

A source electrode SE and a drain electrode DE of the driving transistor DTR may be provided over the interlayer dielectric layer ILD. The source electrode SE and the drain electrode DE of the driving transistor DTR may be connected to the active layer ACT of the driving transistor DTR through a fifth contact hole CH5 passing through the gate insulating layer GI and the interlayer dielectric layer ILD. The source electrode SE and the drain electrode DE of the driving transistor DTR may include a single layer or multi-layer made of one of molybdenum (Mo), aluminum (Al), chromium (Cr), gold (Au), titanium (Ti), nickel (Ni), neodymium (Nd) and copper (Cu), or their alloy.

In the transparent display panel 110 according to one embodiment of the present disclosure, at least a portion of the pixel power line VDDL, the common power line VSSL, the reference line REFL, the data lines DL and the touch lines TL may be formed in the same layer as the source electrode SE and the drain electrode DE of the driving transistor DTR. For example, the pixel power line VDDL, the common power line VSSL and the data lines DL may include the same material as that of the source electrode SE and the drain electrode DE in the same layer as the source electrode SE and the drain electrode DE, but are not limited thereto.

Also, as shown in FIG. 7, in the transparent display panel 110 according to one embodiment of the present disclosure, the cathode contact electrode CCT may include the same material as that of the source electrode SE and the drain electrode DE in the same layer as the source electrode SE and the drain electrode DE. First and second passivation layers PAS1 and PAS2 may be provided with a second opening area OA2 that is formed to expose at least a portion of an upper surface of the cathode contact electrode CCT. A second undercut structure UC2 may be formed in such a manner that a planarization layer PLN is more protruded than the first and second passivation layers PAS1 and PAS2 in the second opening area OA2 of the first and second passivation layers PAS1 and PAS2. Therefore, the second undercut structure UC2 may expose at least a portion of a lower surface of the planarization layer PLN, and may expose at least a portion of the upper surface of the cathode contact electrode CCT without having the first and second passivation layers PAS1 and PAS2 below the exposed lower surface. The cathode contact electrode CCT may be connected to a cathode electrode CE over the upper surface exposed by the second undercut structure UC2. The cathode contact electrode CCT may be connected to the power connection line VCL through the sixth contact hole CH6, and may transfer a cathode power source supplied from the common power line VSSL to the cathode electrode CE through the power connection line VCL.

Also, as shown in FIG. 8, in the transparent display panel 110 according to one embodiment of the present disclosure, a connection electrode CTE may include the same material as that of the source electrode SE and the drain electrode DE in the same layer as the source electrode SE and the drain electrode DE. The connection electrode CTE may electrically connect the touch connection line TCL with the touch contact electrode TCT. One end of the connection electrode CTE may be connected to the touch connection line TCL through the seventh contact hole CH7, and the other end thereof may be connected to the touch contact electrode TCT through an eighth contact hole CH8. In FIG. 8, the touch connection line TCL is shown as being connected to the touch contact electrode TCT through the connection electrode CTE, but is not limited thereto. In another embodiment, the touch connection line TCL may be directly connected to the touch contact electrode TCT, and in this case, the touch contact electrode TCT may be formed in the same layer as the source electrode SE and the drain electrode DE.

The first passivation layer PAS1 for insulating the driving transistor DTR may be provided over the source electrode SE and the drain electrode DE of the driving transistor DTR, and the second passivation layer PAS2 may be provided over the first passivation layer PAS1.

The first and second passivation layers PAS1 and PAS2 may be provided in the non-transmissive area NTA and the transmissive area TA. However, the first and second passivation layers PAS1 and PAS2 may be provided with a first opening area OA1, which exposes the buffer layer BF without being provided in at least a portion of the transmissive area TA, to form the first undercut structure UC1 in the transmissive area TA. The first opening area OA1 of the first and second passivation layers PAS1 and PAS2 may at least partially overlap the first opening area OA1 of the interlayer dielectric layer ILD and the first opening area OA1 of the gate insulating layer GI. The first and second passivation layers PAS1 and PAS2 may include an inorganic layer, for example, a silicon oxide layer (SiOx), a silicon nitride layer (SiNx) or a multi-layer of the silicon oxide layer and the silicon nitride layer.

In the transparent display panel 110 according to one embodiment of the present disclosure, as shown in FIG. 8, the touch contact electrode TCT may be disposed between the first passivation layer PAS1 and the second passivation layer PAS2 to electrically connect the touch connection line TCL with the touch sensor electrode TSE. The touch contact electrode TCT may be connected to the connection electrode CTE through the eighth contact hole CH8, and may be electrically connected to the touch connection line TCL through the connection electrode CTE.

Also, at least a portion of the upper surface of the touch contact electrode TCT may be exposed by a third undercut structure UC3, and the touch sensor electrode TSE may be connected to the exposed upper surface. In detail, the second passivation layer PAS2 may be provided with a third opening area OA3 that is formed to expose at least a portion of the upper surface of the touch contact electrode TCT. The third undercut structure UC3 may be formed in such a manner that the planarization layer PLN is more protruded than the second passivation layer PAS2 in the third opening area OA3 of the second passivation layer PAS2. Therefore, the third undercut structure UC3 may expose at least a portion of the lower surface of the planarization layer PLN, and may expose at least a portion of the upper surface of the touch contact electrode TCT without having the second passivation layer PAS2 below the exposed lower surface. The third undercut structure UC3 may be provided inside the area where the first undercut structure UC1 is provided. That is, the third undercut structure UC3 may be disposed in an area in which the touch sensor TS is provided.

The touch sensor electrode TSE may be deposited on the exposed upper surface of the touch contact electrode TCT, and may be electrically connected with the touch contact electrode TCT. The touch contact electrode TCT may transfer a change in capacitance of the touch sensor electrode TSE to the touch line TL through the touch connection line TCL and the touch bridge line TBL.

The planarization layer PLN may be provided over the second passivation layer PAS2 to planarize a step difference due to the driving transistor DTR and the plurality of signal lines. The planarization layer PLN may be provided in the non-transmissive area NTA, and may not be provided in at least a portion of the transmissive area TA to form the first undercut structure UC1 in the transmissive area TA. The planarization layer PLN may include an organic layer such as an acrylic resin, an epoxy resin, a phenolic resin, a polyamide resin and a polyimide resin.

In the transparent display panel 110 according to one embodiment of the present disclosure, the first undercut structure UC1 may be formed using the planarization layer PLN and the plurality of inorganic insulating layers, for example, the first and second passivation layers PAS1 and PAS2, the interlayer dielectric layer ILD and the gate insulating layer GI. In detail, the first undercut structure UC1 may be formed in such a manner that the planarization layer PLN is more protruded than the plurality of inorganic insulating layers, for example, the first and second passivation layers PAS1 and PAS2, the interlayer dielectric layer ILD and the gate insulating layer GI in a direction of the transmissive area TA. Therefore, the first undercut structure UC1 may expose at least a portion of the lower surface of the planarization layer PLN, and the plurality of inorganic insulating layers may not be provided below the exposed lower surface so that a gap space with the buffer layer BF may be provided.

The first undercut structure UC1 may be formed through a wet etching process. The wet etching process for forming the first undercut structure UC1 may be isotropic etching in view of properties. Therefore, in the first undercut structure UC1, a first gap distance d1 from an end of the planarization layer PLN to an end of the plurality of inorganic insulating layers may be formed in the same manner as a second gap distance d2 from the lower surface of the planarization layer PLN to the upper surface of the buffer layer BF. At this time, the first gap distance d1 of the first undercut structure UC1 should have a minimum distance value, for example, 2 um or more in order to make sure of isolation between the cathode electrode CE and the touch sensor electrode TSE. Therefore, since the second gap distance d2 of the first undercut structure UC1 should be greater than or equal to 2 um, a sum of thicknesses of the first and second passivation layers PAS1, PAS2, the interlayer dielectric layer ILD and the gate insulating film GI may be 2 um or more.

The first undercut structure UC1 is provided in the transmissive area TA, and may have a planar closed shape. For example, the first undercut structure UC1 may be provided along an edge of the transmissive area TA. At this time, the first undercut structure UC1 may be provided to surround the touch sensor TS.

In the transparent display panel 110 according to one embodiment of the present disclosure, the first undercut structure UC1 may be formed using the planarization layer PLN and the plurality of inorganic insulating layers, whereby light transmittance may be prevented from being reduced due to the first undercut structure UC1.

A light emitting element, which includes a first electrode 120, an organic light emitting layer 130 and a second electrode 140, and a bank 125 may be provided over the planarization layer PLN.

The first electrode 120 may be provided over the planarization layer PLN for each of the subpixels SP1, SP2, SP3 and SP4. The first electrode 120 is not provided in the transmissive area TA. The first electrode 120 may be connected to the driving transistor DTR. In detail, the first electrode 120 may be connected to one of the source electrode SE and the drain electrode DE of the driving transistor DTR through a contact hole (not shown) that passes through the planarization layer PLN and the first and second passivation layer PAS1 and PAS2.

The first electrode 120 may include a metal material having high reflectance, such as a stacked structure (Ti/Al/Ti) of aluminum and titanium, a stacked structure (ITO/Al/ITO) of aluminum and ITO, an Ag alloy, a stacked structure (ITO/Ag alloy/ITO) of Ag alloy and ITO, a MoTi alloy, and a stacked structure (ITO/MoTi alloy/ITO) of MoTi alloy and ITO. The Ag alloy may be an alloy of silver (Ag), palladium (Pd), copper (Cu), etc. The MoTi alloy may be an alloy of molybdenum (Mo) and titanium (Ti). The first electrode 120 may be an anode electrode.

The bank 125 may be provided over the planarization layer PLN. The bank 125 may be provided to at least partially cover an edge of the first electrode 120 and expose a portion of the first electrode 120. Therefore, the bank 125 may prevent a problem in which light emitting efficiency is deteriorated due to concentration of a current on an end of the first electrode 120.

The bank 125 may define light emission areas EA1, EA2, EA3 and EA4 of the subpixels SP1, SP2, SP3 and SP4. The light emission areas EA1, EA2, EA3 and EA4 of each of the subpixels SP1, SP2, SP3 and SP4 represent an area in which the first electrode 120, the organic light emitting layer 130 and the cathode electrode CE are sequentially stacked and holes from the first electrode 120 and electrons from the cathode electrode CE are combined with each other in the organic light emitting layer 130 to emit light. In this case, the area in which the bank 125 is provided may become the non-light emission area NEA because light is not emitted therefrom, and the area in which the bank 125 is not provided and the first electrode is exposed may become the light emission area EA.

The bank 125 may include an organic layer such as an acrylic resin, an epoxy resin, a phenolic resin, a polyamide resin, and a polyimide resin.

The organic light emitting layer 130 may be disposed over the first electrode 120. The organic light emitting layer 130 may include a hole transporting layer, a light emitting layer and an electron transporting layer. In this case, when a voltage is applied to the first electrode 120 and the cathode electrode CE, holes and electrons move to the light emitting layer through the hole transporting layer and the electron transporting layer, respectively and are combined with each other in the light emitting layer to emit light.

In one embodiment, the organic light emitting layer 130 may be a common layer commonly provided in the subpixels SP1, SP2, SP3 and SP4. In this case, the light emitting layer may be a white light emitting layer for emitting white light.

In another embodiment, the light emitting layer of the organic light emitting layer 130 may be provided for each of the subpixels SP1, SP2, SP3 and SP4. For example, a green light emitting layer for emitting green light may be provided in the first subpixel SP1, a red light emitting layer for emitting red light may be provided in the second subpixel SP2, a blue light emitting layer for emitting blue light may be provided in the third subpixel SP3, and a white light emitting layer for emitting white light may be provided in the fourth subpixel SP4. In this case, the light emitting layer of the organic light emitting layer 130 is not provided in the transmissive area TA.

An organic light emitting layer 130 may be separated between the non-transmissive area NTA and the transmissive area TA by the first undercut structure UC1. In detail, the organic light emitting layer 130 may be separated into an organic light emitting layer 131 provided in the non-transmissive area NTA and an organic light emitting layer 132 provided in the transmissive area TA by the first undercut structure UC1. That is, the organic light emitting layer 131 provided in the non-transmissive area NTA and the organic light emitting layer 132 provided in the transmissive area TA may be spaced apart from each other by the first undercut structure UC1.

A second electrode 140 may be disposed over the organic light emitting layer 130 and the bank 125. When the second electrode 140 is deposited on an entire surface, the second electrode 140 may be separated without being continuous between the non-transmissive area NTA and the transmissive area TA by the first undercut structure UC1. In detail, the second electrode 140 may be separated into a second electrode CE provided in the non-transmissive area NTA and a second electrode TSE provided in the transmissive area TA by the first undercut structure UC1.

In this case, the second electrode CE provided in the non-transmissive area NTA may be a cathode electrode CE, and is an element constituting a light emitting element. The cathode electrode CE may be connected to a cathode contact portion CCT to receive a power source from the common power line VSSL. The cathode electrode CE may be a common layer that is commonly provided in the subpixels SP1, SP2, SP3 and SP4 to apply the same voltage.

Also, the second electrode TSE provided in the transmissive area TA is a touch sensor electrode TSE, and may be an element constituting the touch sensor TS. The touch sensor electrode TSE may be connected to a touch contact electrode TCT to provide a change in capacitance to the touch line TL.

The second electrode 140, which includes the cathode electrode CE and the touch sensor electrode TSE, may include a transparent conductive material (TCO) such as ITO and IZO, which may transmit light, or a semi-transmissive conductive material such as magnesium (Mg), silver (Ag) or an alloy of magnesium (Mg) and silver (Ag). When the second electrode 140 includes a semi-transmissive conductive material, light emitting efficiency may be increased by a micro cavity.

An encapsulation layer 150 may be provided over the light emitting elements and the touch sensors TS. The encapsulation layer 150 may be provided over the cathode electrode CE and the touch sensor electrode TSE to at least partially cover the cathode electrode CE and the touch sensor electrode TSE.

The encapsulation layer 150 serves to prevent oxygen or water from being permeated into the organic light emitting layer 130, the cathode electrode CE and the touch sensor electrode TSE. Accordingly, in some embodiments, the encapsulation layer 150 may include at least one inorganic layer and at least one organic layer.

A color filter CF may be provided over the encapsulation layer 150. The color filter CF may be provided over one surface of the second substrate 112 that faces the first substrate 111. In this case, the first substrate 111 provided with the encapsulation layer 150 and the second substrate 112 provided with the color filter CF may be bonded to each other by an adhesive layer 160. At this time, the adhesive layer 160 may be an optically clear resin (OCR) layer or an optically clear adhesive (OCA) film.

The color filter CF may be provided to be patterned for each of the subpixels SP1, SP2, SP3 and SP4. A black matrix BM may be provided between color filters CF. The black matrix BM may be disposed between the subpixels SP1, SP2, SP3 and SP4 to prevent a color mixture from occurring between adjacent subpixels SP1, SP2, SP3 and SP4. In addition, the black matrix BM may prevent light incident from the outside from being reflected by the plurality of lines, for example, the scan lines SCANL, the pixel power line VDDL, the common power line VSSL, the reference line REFL, data lines DL, etc., provided between the subpixels SP1, SP2, SP3 and SP4.

In the transparent display panel 110 according to one embodiment of the present disclosure, the touch sensor electrode TSE of the touch sensor TS and the cathode electrode CE of the light emitting element may be provided in the same layer using the first undercut structure UC1. In the transparent display panel 110 according to one embodiment of the present disclosure, a touch process is simplified, and a separate mask for the touch sensor electrode TSE is not required.

Also, in the transparent display panel 110 according to one embodiment of the present disclosure, the first undercut structure UC1 may be formed using the planarization layer PLN and the plurality of inorganic insulating layers, whereby the first undercut structure UC1 may be formed without loss of light transmittance.

Also, in the transparent display panel 110 according to one embodiment of the present disclosure, the touch lines TL may be disposed below the light emitting element, whereby light emitting efficiency of the pixel P may be prevented from being deteriorated due to the touch lines TL.

Also, in the transparent display panel 110 according to one embodiment of the present disclosure, the touch lines TL may be disposed so as not to overlap the circuit areas CA1, CA2, CA3 and CA4, whereby influence caused by the circuit element may be reduced or minimized and at the same time uniformity of parasitic capacitance may be improved.

Also, in the transparent display panel 110 according to one embodiment of the present disclosure, the plurality of touch lines TL may be disposed in the first non-transmissive area NTA1, and only one touch bridge line TBL for connecting the plurality of touch sensors TS may be provided in the second non-transmissive area NTA2, whereby decrease in a size of the transmissive area TA or decrease in light transmittance due to the plurality of touch lines TL and the touch bridge line TBL may be reduced or minimized.

As described above, in the transparent display panel 110 according to one embodiment of the present disclosure, the touch sensor electrode TSE of the touch sensor TS and the cathode electrode CE of the light emitting element may be separated from each other by the first undercut structure UC1. However, in the manufacturing process, particles PRT may occur in the first undercut structure UC1 as shown in FIG. 9. In this case, the touch sensor electrode TSE of the touch sensor TS and the cathode electrode CE of the light emitting element may be electrically connected to each other without being separated from each other.

Since all of the touch sensors TS included in one touch block TB are electrically connected to one another, all the touch sensors TS included in the corresponding touch block TB are not normally operated even though a defect occurs only in one of the touch sensors TS. Therefore, as shown in FIG. 9, when the touch sensor electrode TSE of the touch sensor TS and the cathode electrode CE of the light emitting element are connected to each other to generate the defective touch sensor TS, a touch of a user is not sensed in the entire touch block TB in which the defective touch sensor TS is included. In this case, a plurality of defective touch sensors TS may be generated, and may be disposed on their respective touch blocks TB different from one another. In this case, all of the plurality of touch blocks TB in which the plurality of defective touch sensors TS are disposed may not sense the touch, and consequently, a touch defect rate of the transparent display panel 110 may be increased.

The transparent display panel 110 according to one embodiment of the present disclosure may include elements capable of specifying a line area in which the defective touch sensor TS of the plurality of touch sensors TS included in one touch block TB is included. In addition, in the transparent display panel 110 according to one embodiment of the present disclosure, the touch sensors TS included in the specified line area and the touch bridge line TBL may be electrically separated from each other through a repair process.

Hereinafter, the elements capable of specifying the line area in which the defective touch sensor TS is included will be described with reference to FIGS. 10 to 16, and a case that the line area in which the defective touch sensor TS is included is detected using the elements will be described.

Figure 10:
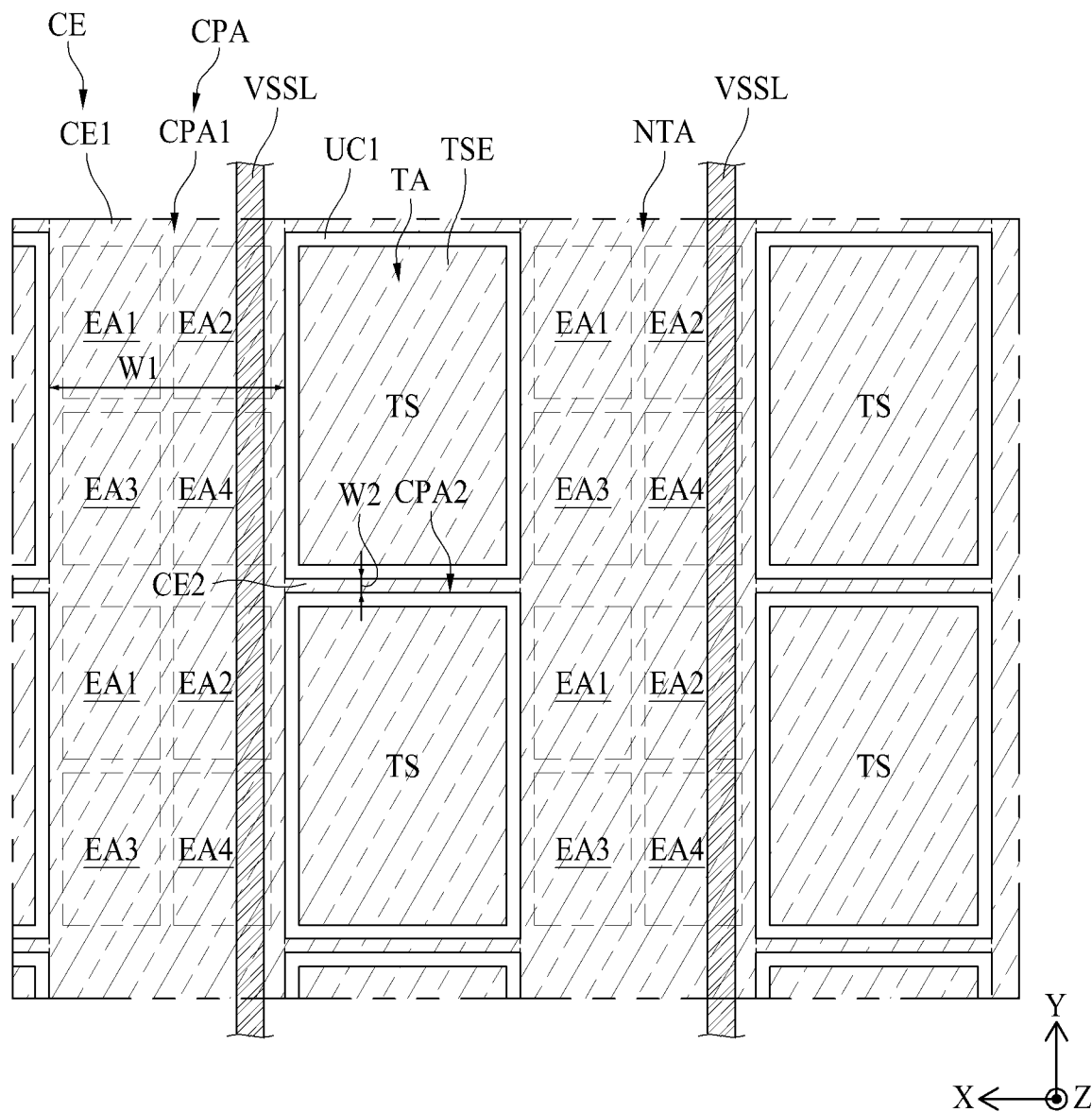
FIG. 10 is a view illustrating an example that a high resistance area is formed in a second cathode power area.
Figure 11:
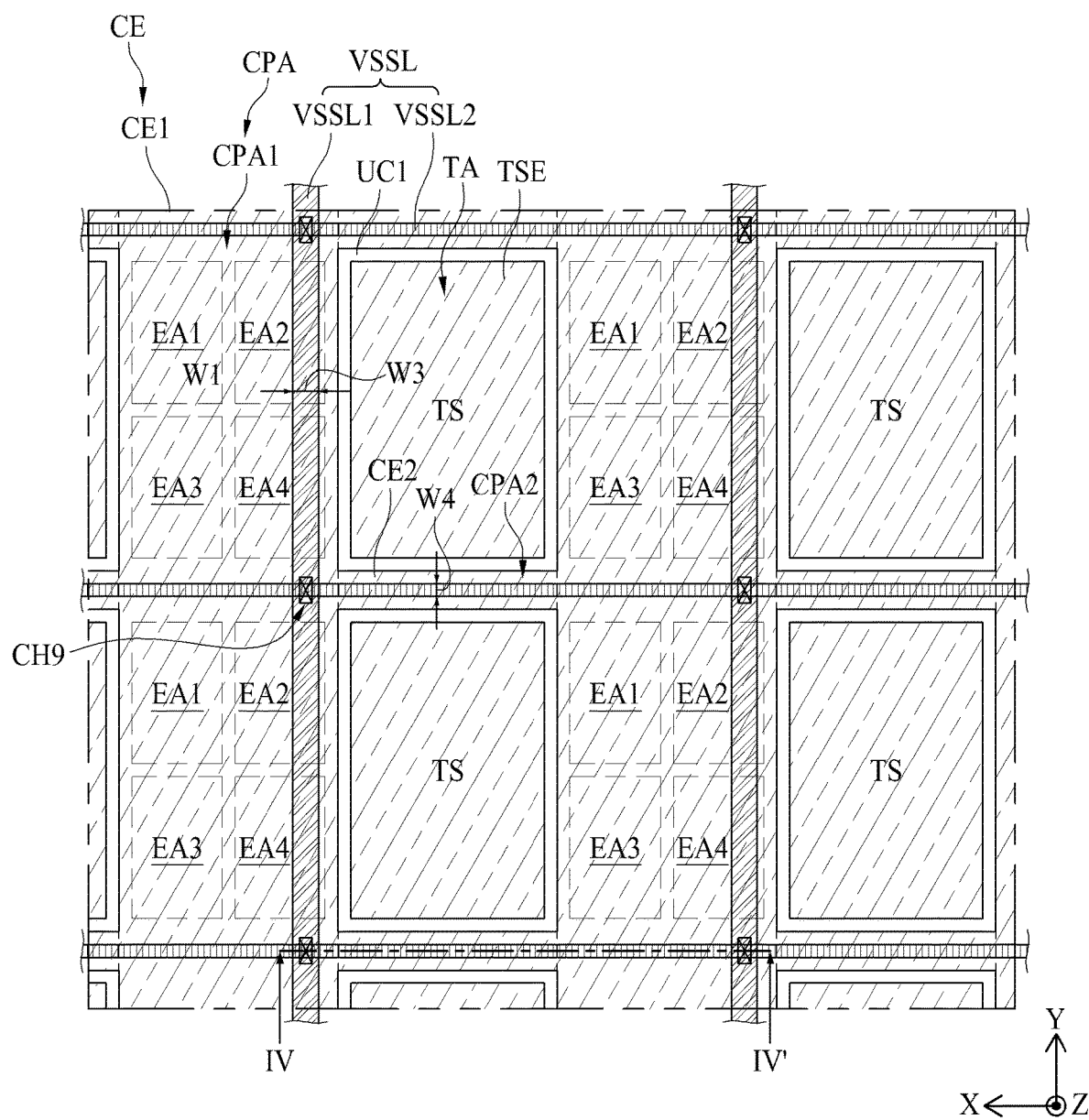
FIG. 11 is a view illustrating another example that a high resistance area is formed in a second cathode power area.
Figure 12:
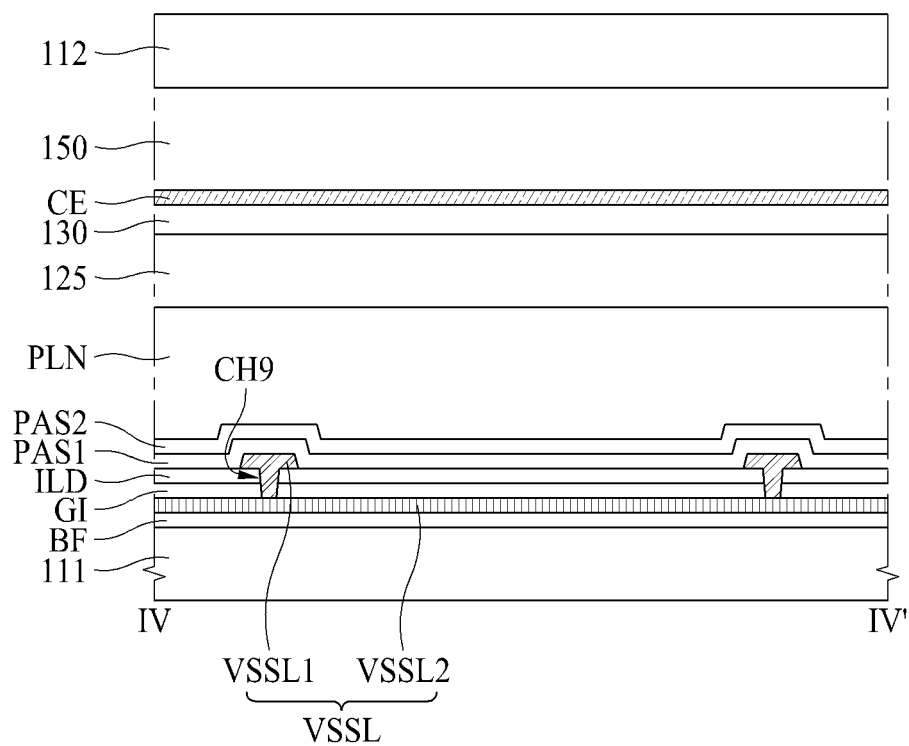
FIG. 12 is a cross-sectional view taken along line IV-IV' of FIG. 11.
Figure 13A:
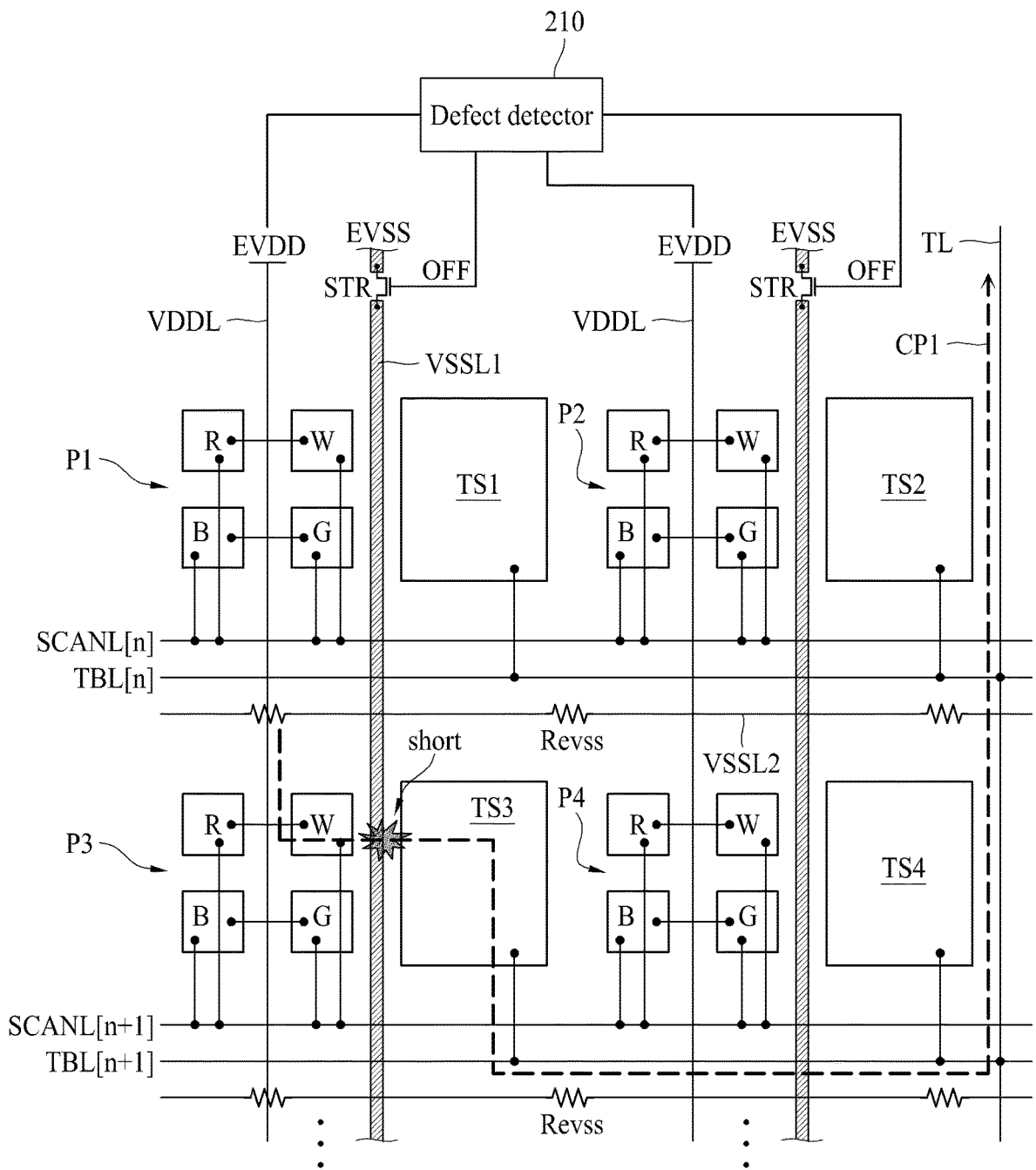
FIGS. 13A to 13C are views illustrating a current path when a defective touch sensor occurs.
Figure 13B:
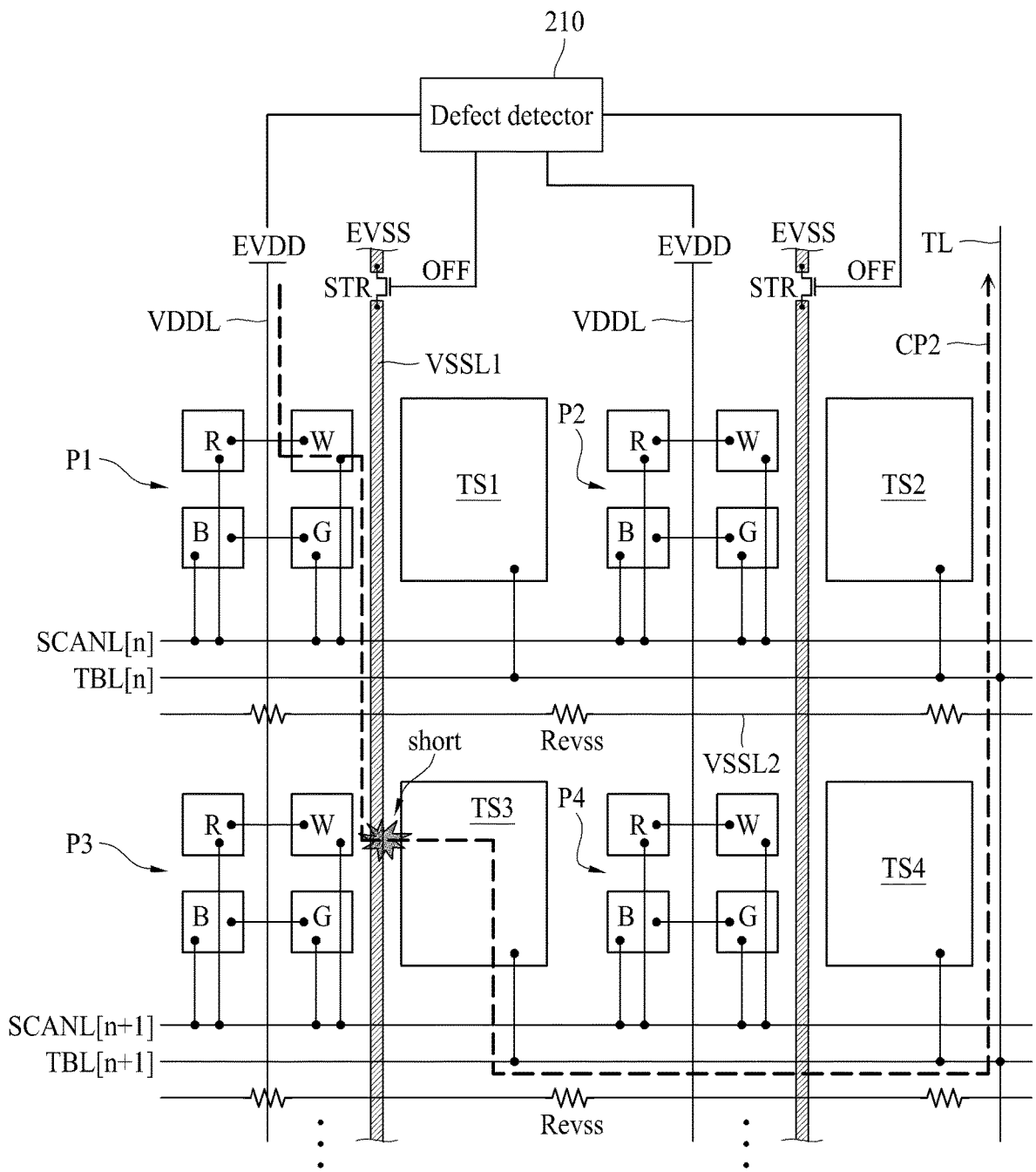
Figure 13C:
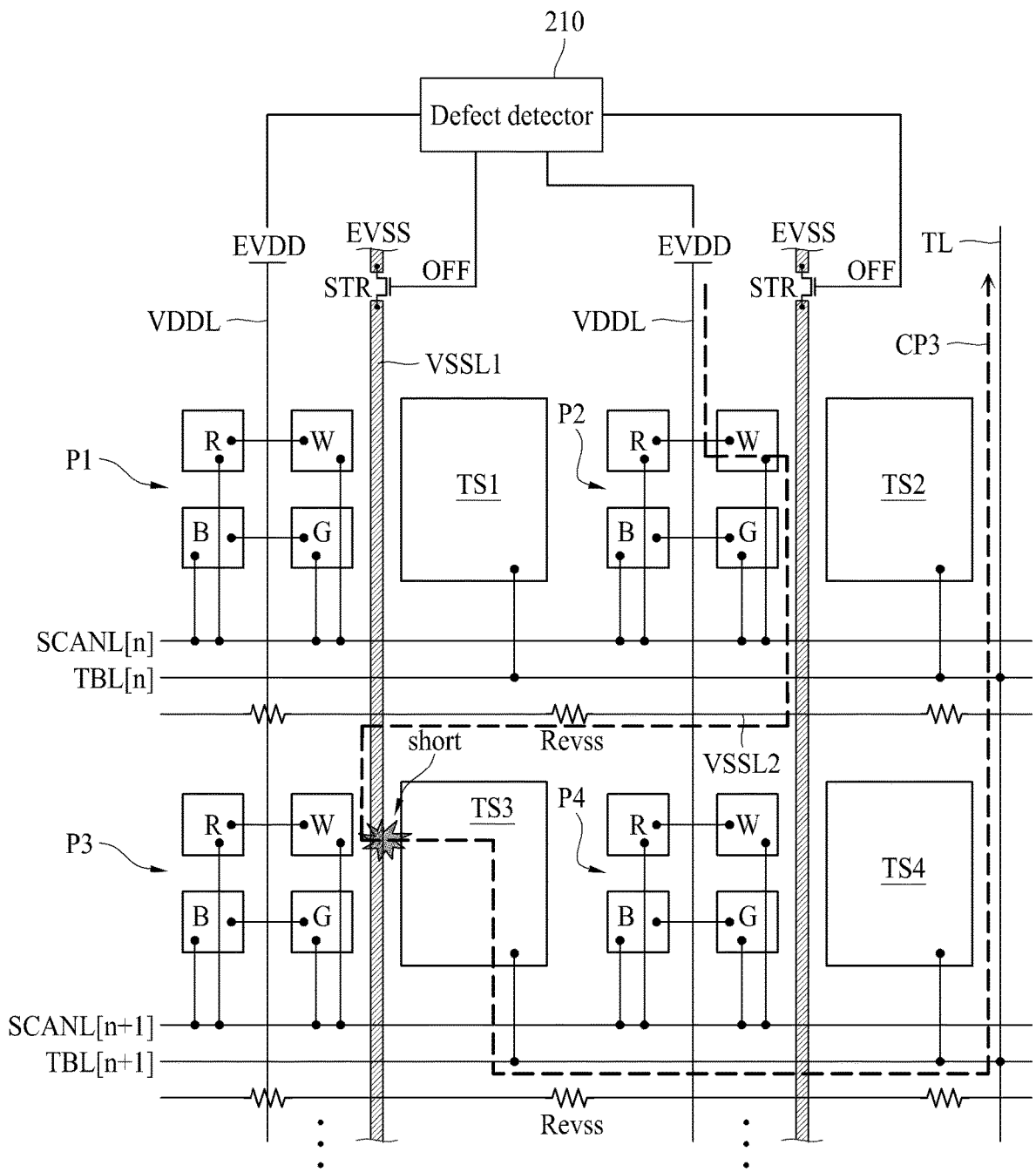
Figure 14:
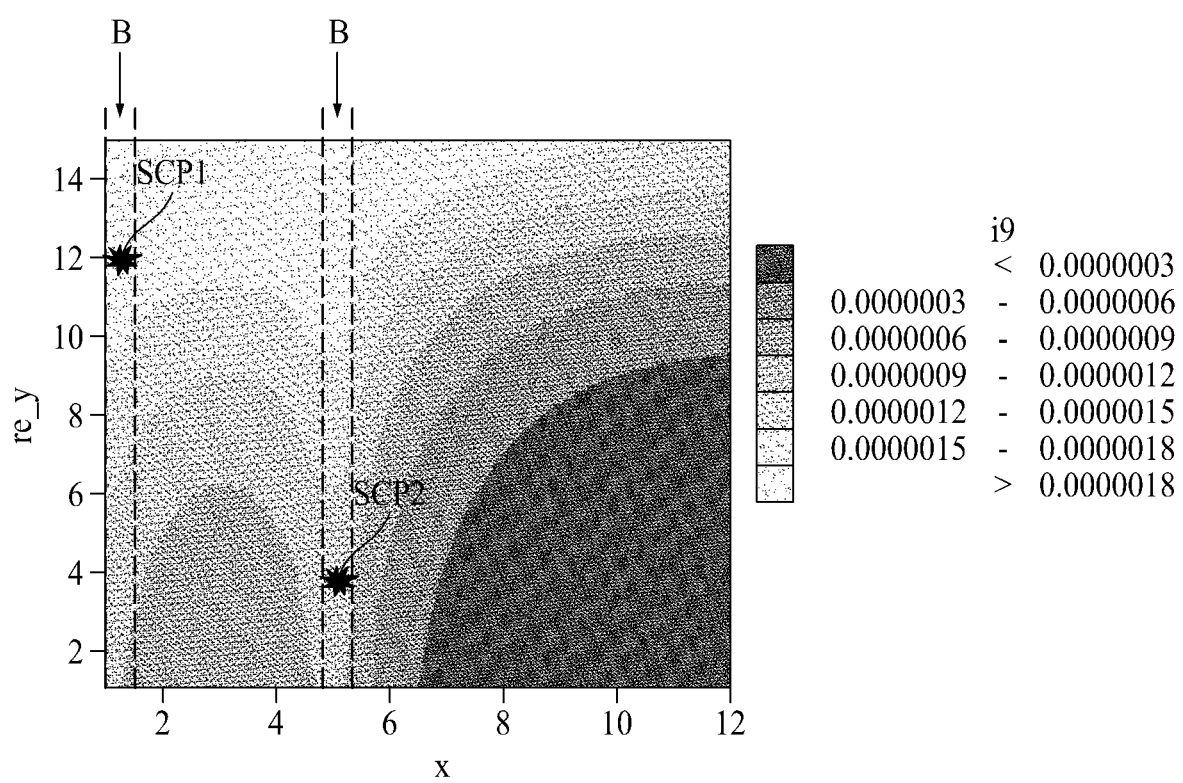
FIG. 14 is a view illustrating luminance of a plurality of pixels when a defective touch sensor occurs.
Figure 15:
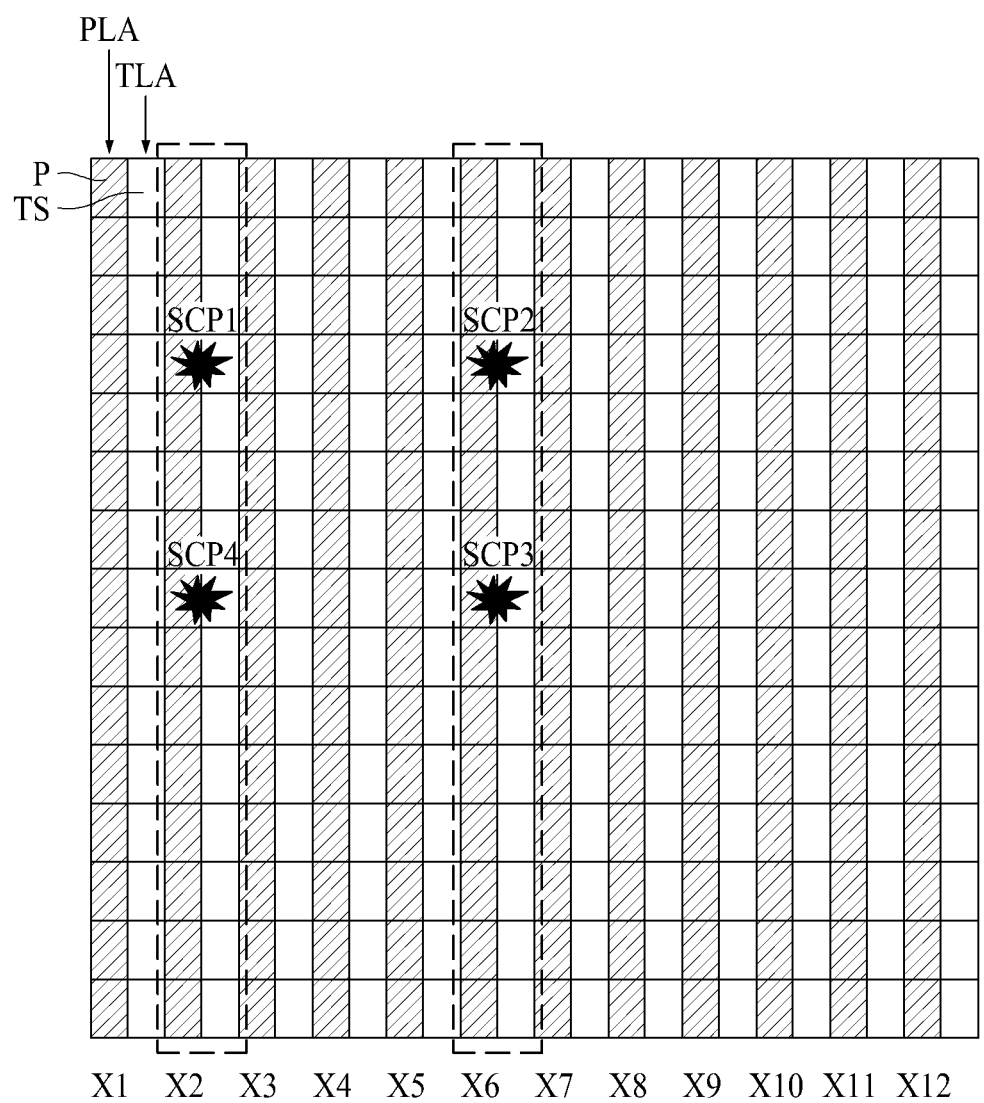
FIG. 15 is a view illustrating an example that a defective touch sensor occurs in one touch block.
Figure 16:
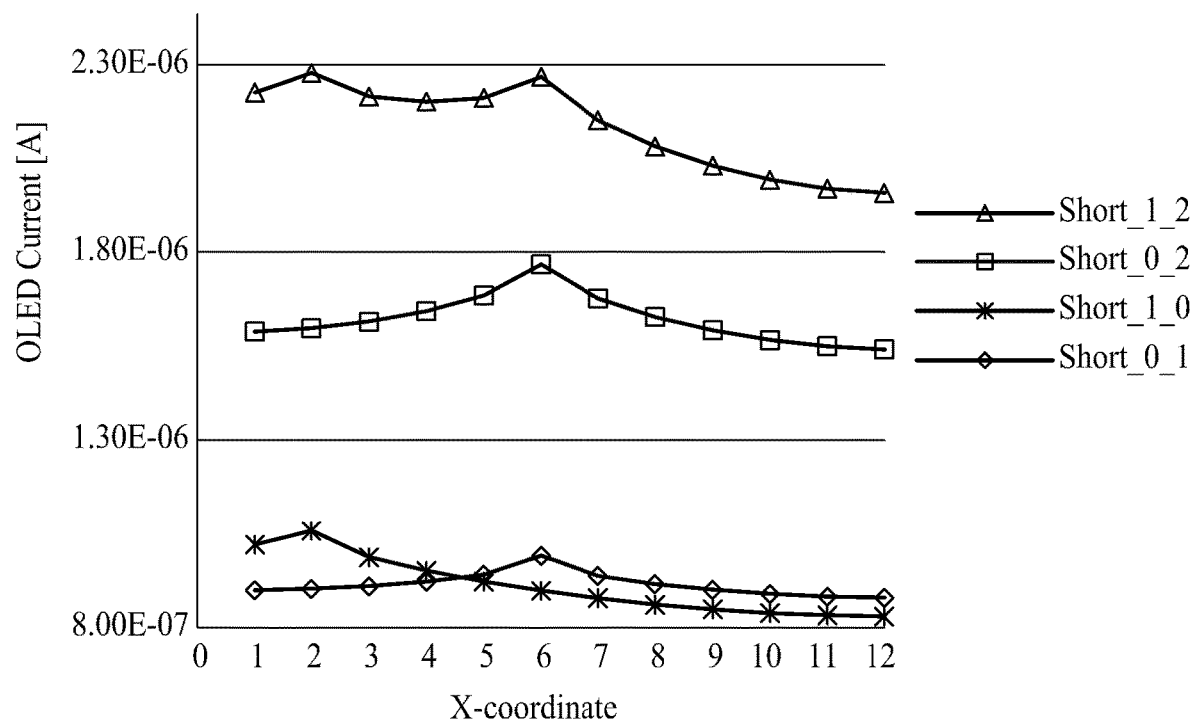
FIG. 16 is a graph illustrating a current per line of a plurality of pixels provided in the touch block of FIG. 15.

FIG. 10 is a view illustrating an example that a high resistance area is formed in a second cathode power area, FIG. 11 is a view illustrating another example that a high resistance area is formed in a second cathode power area, FIG. 12 is a cross-sectional view taken along line IV-IV' of FIG. 11, FIGS. 13A to 13C are views illustrating a current path when a defective touch sensor occurs, FIG. 14 is a view illustrating luminance of a plurality of pixels when a defective touch sensor occurs, FIG. 15 is a view illustrating an example that a defective touch sensor occurs in one touch block, and FIG. 16 is a graph illustrating a current per line of a plurality of pixels provided in the touch block of FIG. 15.

As shown in FIGS. 10 to 12, in the transparent display panel 110 according to one embodiment of the present disclosure, a high resistance area may be provided in a cathode power area CPA to which a cathode power source is applied, and a line area in which the defective touch sensor TS is included may be detected using the high resistance area.

In detail, the non-transmissive area NTA may include a cathode power area CPA to which a cathode power source is applied. The cathode power area CPA may include a first cathode power area CPA1 provided between two touch sensors TS adjacent to each other in the second direction (X-axis direction) and a second cathode power area CPA2 provided between two touch sensors TS adjacent to each other in the first direction (Y-axis direction).

The transparent display panel 110 according to one embodiment of the present disclosure is characterized in that the second cathode power area CPA2 has resistance higher than that of the first cathode power area CPA1. In one embodiment, the second cathode power area CPA2 may be a high resistance area having resistance of 1kΩ or more.

As one of methods of implementing the second cathode power area CPA2 as the high resistance area, the cathode electrode CE may be formed to be thin as shown in FIG. 10.

The cathode electrode CE may include a first cathode electrode CE1 and a second cathode electrode CE2. The first cathode electrode CE1 may be disposed to at least partially overlap the common power line VSSL extended in the first direction (Y-axis direction). The first cathode electrode CE1 may be connected to the common power line VS SL through the power connection line VCL and the cathode contact electrode CCT so that a cathode power source from the common power line VSSL may be applied thereto. The first cathode electrode CE1 may be provided in the first cathode power area CPA1, and may have a first width W1.

The second cathode electrode CE2 may be provided in the second cathode power area CPA2, and may have a second width W2. The second cathode electrode CE2 is in contact with the first cathode electrode CE1, and the cathode power source from the common power line VSSL may be applied thereto through the first cathode electrode CE1.

In the transparent display panel 110 according to one embodiment of the present disclosure, the second width W2 of the second cathode electrode CE2 may be thinner than the first width W1, so that the second cathode electrode CE2 may have resistance of 1kΩ or more. In one embodiment, the second width W2 of the second cathode electrode CE2 may be smaller than 50 um. Therefore, high resistance of 1kΩ or more may be implemented in the second cathode power area CPA2 in which the second cathode electrode CE2 is provided.

As the other one of the methods of implementing the second cathode power area CPA2 as the high resistance area, the common power line VSSL may include a high resistance material as shown in FIGS. 11 and 12.

The common power line VSSL may include a first common power line VSSL1 and a second common power line VSSL2. The first common power line VSSL1 may be provided in the first cathode power area CPA1 and extended in the first direction (Y-axis direction). The first common power line VSSL1 may include a plurality of layers. The first common power line VSSL1 may include a first line provided in a first layer and a second line provided in a second layer, wherein the first line and the second line may be electrically connected to each other through a contact hole. For example, the first common power line VSSL1 may include a first line provided in the same layer as the source electrode SE and the drain electrode DE of the driving transistor DTR and a second line provided in a layer provided between the first passivation layer PAS1 and the second passivation layer PAS2. The first common power line VSSL1 may have a third width W3. The first common power line VSSL1 may be connected to the cathode electrode CE through the power connection line VCL and the cathode contact electrode CCT to apply the cathode power source to the cathode electrode CE.

The second common power line VSSL2 may be extended in the second direction (X-axis direction). The second common power line VSSL2 may be connected to the first common power line VSSL1 through a ninth contact hole CH9, so that the cathode power source may be applied thereto through the first common power line VSSL1.

In the transparent display panel 110 according to one embodiment of the present disclosure, the second common power line VSSL2 may include a high resistance material, so that the second common power line VSSL2 may have resistance of 1kΩ or more. In one embodiment, the second common power line VSSL2 may include a silicon-based semiconductor material or an oxide-based semiconductor material. For example, the second common power line VSSL2 may include the same material as that of the active layer ACT of the driving transistor DTR in the same layer as the active layer ACT of the driving transistor DTR as shown in FIG. 12. The second common power line VSSL2 provided in the same layer as the active layer ACT may be connected to the first common power line VSSL1 provided in the same layer as the source electrode SE and the drain electrode DE through the ninth contact hole CH9.

The second common power line VSSL2 may have a fourth width W4 smaller than the third width W3. Since the second common power line VSSL2 thinly includes a silicon-based semiconductor material or an oxide-based semiconductor material as compared with the first common power line VSSL1 and includes a single layer, the second common power line VSSL2 may have high resistance. High resistance of 1kΩ or more may be implemented in the second cathode power area CPA2 provided in the second common power line VSSL2.

In the transparent display panel 110 according to one embodiment of the present disclosure, the high resistance area having high resistance of 1kΩ or more may be provided in the cathode power area CPA as described above, whereby the line area in which the defective touch sensor TS is included may be detected.

Referring to FIGS. 13A to 13C, in the transparent display panel 110 according to one embodiment of the present disclosure, the common power line VSSL may be floated to detect the defective touch sensor TS. The transparent display panel 110 according to one embodiment of the present disclosure may further include a switching transistor STR to float the common power line VSSL. The switching transistor STR may connect or disconnect the common power line VS SL to or from a cathode power supply source in accordance with a control signal. The switching transistor STR may separate the common power line VSSL from the cathode power supply source in accordance with a defect detection control signal of a turn-off level. When the switching transistor STR is turned off, the common power line VSSL may be in a floating state. In addition, the switching transistor STR may connect the common power line VS SL to the cathode power supply source in accordance with a general control signal of a turn-on level. When the switching transistor STR is turned on, a cathode power source EVSS from the cathode power supply source may be applied to the common power line VSSL. The common power line VSSL may transfer the cathode power source EVSS to the cathode electrode CE.

In the transparent display panel 110 according to one embodiment of the present disclosure, a voltage may be applied to each of the pixel power line VDDL and the touch line TL. In the transparent display panel 110 according to one embodiment of the present disclosure, a first voltage, e.g., 24V may be applied to the pixel power line VDDL, and a second voltage lower than the first voltage, e.g., 0V may be applied to the touch line TL. At this time, the pixel power line VDDL may be connected to each of subpixels R, W, B and G of pixels P1, P2, P3 and P4. The touch line TL may be connected to each of a plurality of touch sensors TS1, TS2, TS3 and TS4 through the touch bridge line TBL.

When a short-circuit occurs between the touch sensor electrode TSE of the third touch sensor TS3 and the cathode electrode CE of the third pixel P3, the touch sensor electrode TSE of the third touch sensor TS3 may be electrically connected to the cathode electrode CE of the third pixel P3. In this case, a first current may be generated from the pixel power line VDDL of the first voltage to the touch line TL of the second voltage as shown in FIG. 13A. In detail, a first current flows from the pixel power line VDDL to the touch sensor electrode TSE of the third defective touch sensor TS3 by passing through the cathode electrode CE of the third defective pixel P3, and flows from the touch sensor electrode TSE of the third defective touch sensor TS3 to the touch line TL by passing through the touch bridge line TBL, whereby a first current path CP1 may be formed.

Meanwhile, the current may be generated between peripheral pixels P1 and P2 and the third defective touch sensor TS3 having a defect in addition to the third defective pixel P3 having a defect.

As shown in FIG. 13B, a second current may be generated between the first normal pixel P1 and the third defective touch sensor TS3 having a defect. In this case, the first normal pixel P1 may be a normal pixel connected to the same pixel power line VDDL as that of the third defective pixel P3 having a defect, and may include pixels disposed in the first direction (Y-axis direction) from the third defective pixel P3.

In detail, the second current flows from the pixel power line VDDL to the touch sensor electrode TSE of the third defective touch sensor TS3 by passing through the cathode electrode CE of the first normal pixel P1 and the cathode electrode CE of the third defective pixel P3 and flows from the touch sensor electrode TSE of the third defective touch sensor TS3 to the touch line TL by passing through the touch bridge line TBL, whereby a second current path CP2 may be formed.

At this time, the second current may flow from the cathode electrode CE of the first normal pixel P1 to the cathode electrode CE of the third defective pixel P3 through the first cathode electrode CE1 provided in the first cathode power area CPA1 extended in the first direction (Y-axis direction) or the first common power line VSSL1. The first common power line VSSL1 may include a plurality of layers, and may have a third width W3 that is wider than that of the second common power line VSSL2. In addition, the first cathode electrode CE1 may have a first width W1 that is wider than that of the second cathode electrode CE2. As a result, the first cathode power area CPA1 may have low resistance. Therefore, even though the second current passes through the first cathode electrode CE1 provided in the first cathode power area CPA1 or the first common power line VSSL1 between the cathode electrode CE of the first normal pixel P1 and the cathode electrode CE of the third defective pixel P3, its amount may not be significantly reduced. That is, the second current may be equal to or similar to the first current.

As shown in FIG. 13C, a third current may be generated between the second normal pixel P2 and the third defective touch sensor TS3 having a defect. In this case, the second normal pixel P2 may be a normal pixel connected to the pixel power line VDDL different from the pixel power line VDDL to which the third defective pixel P3 having a defect is connected, and may include pixels disposed in the second direction (X-axis direction) from the third defective pixel P3.

In detail, the third current flows from the pixel power line VDDL to the touch sensor electrode TSE of the third defective touch sensor TS3 by passing through the cathode electrode CE of the second normal pixel P2 and the cathode electrode CE of the third defective pixel P3 and flows from the touch sensor electrode TSE of the third defective touch sensor TS3 to the touch line TL by passing through the touch bridge line TBL, whereby a third current path CP3 may be formed.

At this time, the third current may flow from the cathode electrode CE of the second normal pixel P2 to the cathode electrode CE of the third defective pixel P3 through the second cathode electrode CE2 provided in the second cathode power area CPA2 extended in the second direction (X-axis direction) or the second common power line VSSL2.

The second common power line VSSL2 may include a single layer, may be made of a silicon-based semiconductor material or an oxide-based semiconductor material, and may have a fourth width W4 that is thinner than that of the first common power line VSSL1. In addition, the second cathode electrode CE2 may have a second width W2 that is thinner than that of the first cathode electrode CE1. As a result, the second cathode power area CPA2 may have high resistance Revss. Therefore, when the third current passes through the second cathode electrode CE2 provided in the second cathode power area CPA2 or the second common power line VSSL2 between the cathode electrode CE of the second normal pixel P2 and the cathode electrode CE of the third defective pixel P3, its amount may be significantly reduced by high resistance Revss. That is, the amount of the third current may be smaller than the first current or the second current.

Consequently, the current flows to the second normal pixel P2 disposed in the second direction (X-axis direction) in the third defective pixel P3 at a smaller amount than that of the third defective pixel P3. Therefore, as shown in FIG. 14, luminance of the second normal pixel P2 may be smaller than that of the third defective pixel P3. Further, as the second normal pixel P2 becomes far away from the third defective pixel P3 in the second direction (X-axis direction), a length of the second normal pixel P2, which passes through the second cathode electrode CE2 provided in the second cathode power area CPA2 or the second common power line VSSL2, is increased, whereby the amount of the current that is reduced may be increased. Therefore, as shown in FIG. 14, as the second normal pixel P2 becomes far away from the third defective pixel P3 in the second direction (X-axis direction), its luminance may be reduced.

Meanwhile, since all of the first current, the second current and the third current pass through the third defective pixel P3, the third defective pixel P3 may have luminance higher than that of the pixels P1, P2 and P4 adjacent thereto. Therefore, when the first voltage and the second voltage are applied to the pixel power line VDDL and the touch line TL, respectively, a bright line B in the first direction (Y-axis direction) occurs in points SCP1 and SCP2, in which a short-circuit occurs, between the touch sensor electrode TSE of the touch sensor TS and the cathode electrode CE of the pixel P as shown in FIG. 14.

In the transparent display panel 110 according to one embodiment of the present disclosure, a line area in which the defective touch sensor TS is included may be detected in one touch block TB by using the fact that the bright line B of the first direction (Y-axis direction) occurs in the points SCP1 and SCP2 in which a short-circuit occurs. In detail, the transparent display panel 110 according to one embodiment of the present disclosure may include a defect detector 210 for detecting the defective touch sensor TS. The defect detector 210 may be an element included in an external circuit board (not shown), or may be an element included in an external defect inspection equipment.

The defect detector 210 may detect a touch block TB, in which the defective touch sensor TS is included, by sensing the plurality of touch lines TL connected to the plurality of touch blocks TB one-to-one. As shown in FIG. 15, one touch block TB may include a plurality of touch line areas TLA in which the plurality of touch sensors TS are disposed in a line in the first direction (Y-axis direction) and a plurality of pixel line areas PLA in which the plurality of pixels P are disposed in a line in the first direction (Y-axis direction). The plurality of pixel line areas PLA may be disposed to correspond to the plurality of touch line areas TLA one-to-one, and the pixel power line VDDL may be provided in each of the plurality of pixel line areas PLA.

The defect detector 210 may detect the touch line area TLA, in which the defective touch sensor TS is included, in the touch block TB. To this end, the defect detector 210 may control the switching transistor STR to be turned off, thereby separating the common power line VS SL from the cathode power supply source. The defect detector 210 may control the first voltage, for example, 24V, to be applied to the pixel power line VDDL, and may control the second voltage lower than the first voltage, e.g., 0V, to be applied to the touch line TL.

The defect detector 210 may sense the current per pixel line areas PLA of the plurality of pixels P through the pixel power line VDDL provided in each of the plurality of pixel line areas PLA. The defect detector 210 may detect the defective touch line area TLA, in which the defective touch sensor TS is included, based on the current per pixel line area PLA of the plurality of pixels P. The defect detector 210 may check the pixel line area PLA having a current higher than that of a left pixel line area PLA and a right pixel line area PLA, which are adjacent thereto, and may determine the touch line area TLA corresponding to the corresponding pixel line area PLA as a defective touch line area TLA in which the defective touch sensor TS is included.

For example, one touch block TB may include at least one of four short-circuit points SCP1, SCP2, SCP3 and SCP4 as shown in FIG. 15. The current per pixel line areas PLA of the touch block TB may appear as shown in FIG. 16. Referring to FIG. 16, when one touch block TB includes a first short-circuit point SCP1 (Short_1_0), a current of a second pixel line area X2 may be higher than that of the other pixel line areas X1, X3, . . . , X12. When one touch block TB includes a second short-circuit point SCP2 (Short_0_1), a current of a sixth pixel line area X6 may be higher than that of the other pixel line areas X1, . . . , X5, X7, . . . , X12. In addition, when one touch block TB includes the second short-circuit point SCP2 and a fourth short-circuit point SCP4 (Short_0_2), the current of the sixth pixel line area X6 may be higher than that of the other pixel line areas X1, . . . , X5, X7, . . . , X12, and may be higher than the case that the short-circuit point is one. When one touch block TB includes a third short-circuit point SCP3, the second short-circuit point SCP2 and the fourth short-circuit point SCP4 (Short 1_2), the current of the second pixel line area X2 and the sixth pixel line area X6 may be higher than that of the other pixel line areas X1, X3, X4, X5, X7, . . . , X12.

In the transparent display panel 110 according to one embodiment of the present disclosure, the touch connection line TCL connected to the touch sensors TS included in the detected touch line area TLA may be cut by a laser, whereby the defective touch sensor TS and the touch bridge line TBL may be electrically separated from each other. Therefore, the transparent display panel 110 according to one embodiment of the present disclosure may allow the other touch sensors TS of the corresponding touch block TB to operate normally.

In the transparent display panel 110 according to one embodiment of the present disclosure, the touch line area TLA in which the defective touch sensor TS is included may be easily detected in one touch block TB by using the high resistance area of the cathode power area CPA. At this time, in the transparent display panel 110 according to one embodiment of the present disclosure, luminance of the plurality of pixels P may be sensed or the current per pixel line area PLA may be sensed through the pixel power line VDDL, and the touch line area TLA in which the defective touch sensor TS is included may be detected using the sensed luminance or current. In the transparent display panel 110 according to one embodiment of the present disclosure, the high resistance area may be implemented using the existing common power line VSSL or the existing cathode electrode CE. That is, in the transparent display panel 110 according to one embodiment of the present disclosure, since a separate signal line for sensing the voltage of the touch sensor TS is not additionally provided, transmittance may be more improved than the structure in which the voltage of the touch sensor TS is sensed using a separate sensing line.

According to the present disclosure, the following advantageous effects may be obtained.

In the present disclosure, the touch sensor electrode of the touch sensor and the cathode electrode of the light emitting element may be formed using the first undercut structure at the same time, whereby the touch process may be simplified, and a separate mask for the touch sensor electrode does not need to be additionally provided.

Also, in the present disclosure, the touch line area in which the defective touch sensor is included may be easily detected in one touch block by using the high resistance area of the cathode power area.

Also, in the present disclosure, the high resistance area may be implemented using the existing common power line or the existing cathode electrode. That is, in the present disclosure, since a separate signal line for sensing the voltage of the touch sensor is not additionally provided, transmittance may be more improved than the structure in which the voltage of the touch sensor TS is sensed using a separate sensing line.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is intended to cover all variations or modifications derived from the meaning, scope and equivalent concept described in the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display device with a touch sensor, the transparent display device comprising:
   a substrate;
   a plurality of transmissive areas and a non-transmissive area disposed between transmissive areas adjacent to each other on the substrate;

a plurality of touch sensors respectively provided in the plurality of transmissive areas on the substrate, each touch sensor including a touch sensor electrode;

a plurality of pixels disposed in the non-transmissive area on the substrate, each pixel including an anode electrode, a light emitting layer, and a cathode electrode;

a touch line extended in the non-transmissive area in a first direction and electrically connected to the touch sensor electrode; and a common power line electrically connected to the cathode electrode to supply a cathode power source, wherein the non-transmissive area includes a cathode power area to which the cathode power source is applied through the common power line, wherein the cathode power area includes a first cathode power area disposed between the touch sensors adjacent to each other in a second direction and a second cathode power area disposed between the touch sensors adjacent to each other in the first direction, and wherein the second cathode power area has resistance higher than that of the first cathode power area.

2. The transparent display device of claim 1, wherein the second cathode power area has resistance of 1kΩ or more.

3. The transparent display device of claim 1, wherein the cathode electrode includes a first cathode electrode provided in the first cathode power area, having a first width, and a second cathode electrode provided in the second cathode power area, having a second width smaller than the first width.

4. The transparent display device of claim 3, wherein the second cathode electrode has resistance of 1kΩ or more.

5. The transparent display device of claim 3, wherein the second width of the second cathode electrode is smaller than 50 um.

6. The transparent display device of claim 1, wherein the common power line includes a first common power line provided in a first layer in the first cathode power area and a second common power line provided in a second layer in the second cathode power area.

7. The transparent display device of claim 6, wherein the second common power line is made of a silicon-based semiconductor material or an oxide-based semiconductor material.

8. The transparent display device of claim 6, wherein the second common power line has resistance of 1kΩ or more.

9. The transparent display device of claim 6, wherein the first common power line is formed in a same layer as one of a gate electrode, a source electrode, and a drain electrode of a driving transistor, and wherein the second common power line is provided in a same layer as an active layer of the driving transistor.

10. The transparent display device of claim 1, further comprising a switching transistor electrically connecting or separating the common power line to or from a cathode power supply source.

11. The transparent display device of claim 10, wherein the switching transistor separates the common power line from the cathode power supply source in accordance with a defect detection control signal and connects the common power line to the cathode power supply source in accordance with a general control signal.

12. The transparent display device of claim 1, wherein the first cathode power area at least partially overlaps the plurality of pixels, and the second cathode power area does not overlap the plurality of pixels.

13. The transparent display device of claim 1, wherein the cathode electrode is disposed to be spaced apart from the touch sensor electrode in a same layer as the touch sensor electrode.

14. The transparent display device of claim 13, further comprising a first undercut structure provided in the transmissive area, having a planar closed shape, wherein the cathode electrode and the touch sensor electrode are separated from each other by the first undercut structure.

15. The transparent display device of claim 12, further comprising:

a plurality of touch line areas in which the plurality of touch sensors are disposed in a line in the first direction;

a pixel power line electrically connected to the anode electrode; and a defect detector controlling the pixel power line and the touch line to apply a first voltage and a second voltage to each of the pixel power line and the touch line and determining a touch line area, in which a defective touch sensor is included, among the plurality of touch line areas based on a current or luminance of the plurality of pixels emitting light by a current generated between the pixel power line and the touch line.

16. The transparent display device of claim 15, wherein the pixel power line is provided as a plurality of pixel power lines to correspond to the plurality of touch line areas one-to-one, and wherein the defect detector senses a current per pixel line of the plurality of pixels through the plurality of pixel power lines and determines a touch line area corresponding to a pixel line having current higher than that of a left pixel line and a right pixel line, which are adjacent thereto, as a line area in which the defective touch sensor is included.

* * * * *